(12) United States Patent
Lee et al.

(10) Patent No.: US 11,330,700 B2
(45) Date of Patent: May 10, 2022

(54) DISPLAY DEVICE

(71) Applicant: Samsung Display Co., Ltd., Yongin-si (KR)

(72) Inventors: Hyo-Chul Lee, Hwaseong-si (KR); In Soo Wang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/157,813

(22) Filed: Jan. 25, 2021

(65) Prior Publication Data

US 2021/0378088 A1 Dec. 2, 2021

(30) Foreign Application Priority Data

May 29, 2020 (KR) ........................ 10-2020-0065033

(51) Int. Cl.
| | |
|---|---|
| *H05K 1/02* | (2006.01) |
| *H01L 27/32* | (2006.01) |
| *H05K 1/18* | (2006.01) |
| *G06F 3/041* | (2006.01) |
| *G06F 3/044* | (2006.01) |

(52) U.S. Cl.
CPC .......... *H05K 1/0228* (2013.01); *G06F 3/0412* (2013.01); *G06F 3/0446* (2019.05); *H01L 27/323* (2013.01); *H01L 27/3276* (2013.01); *H05K 1/189* (2013.01); *H05K 2201/09227* (2013.01); *H05K 2201/09245* (2013.01); *H05K 2201/10128* (2013.01)

(58) Field of Classification Search
CPC . H01L 27/323; H01L 27/3276; G06F 3/0446; G06F 3/0412; H05K 1/189; H05K 1/0228; H05K 2201/09227; H05K 2201/10128; H05K 2201/09245
See application file for complete search history.

(56) References Cited

U.S. PATENT DOCUMENTS

| | | | | |
|---|---|---|---|---|
| 2013/0328807 A1* | 12/2013 | Matsumoto | ......... | G02F 1/13439 345/173 |
| 2015/0138145 A1* | 5/2015 | Hwang | ................. | G06F 3/0446 345/174 |
| 2018/0120616 A1* | 5/2018 | Kanou | ................... | G06F 3/0412 |
| 2019/0384437 A1 | 12/2019 | Kim et al. | | |

FOREIGN PATENT DOCUMENTS

| | | |
|---|---|---|
| KR | 10-1793424 | 11/2017 |
| KR | 10-2019-0142202 | 12/2019 |

* cited by examiner

*Primary Examiner* — Jimmy H Nguyen
(74) *Attorney, Agent, or Firm* — H.C. Park & Associates, PLC

(57) ABSTRACT

A display device includes: a display panel; an input sensor disposed on the display panel; a flexible circuit board connected to the display panel and the input sensor; a first differential signal line and a second differential signal line, which are disposed on the flexible circuit board and connected to the display panel; and a transmission line and a receiving line, which are disposed on the flexible circuit board and connected to the input sensor. In a plan view, the receiving line is disposed between the first differential signal line and the second differential signal line.

20 Claims, 15 Drawing Sheets

DISPLAY DEVICE

CROSS-REFERENCE TO RELATED APPLICATION

This application claims priority from and the benefit of Korean Patent Application No. 10-2020-0065033, filed May 29, 2020, which is hereby incorporated by reference for all purposes as if fully set forth herein.

BACKGROUND

Field

Exemplary implementations of the invention relate generally to a display device and more specifically, to a display device having an input sensor.

Discussion of the Background

In general, electronic equipment for providing an image to a user such as smartphones, digital cameras, laptop computers, navigations, smart televisions, and the like include display devices for displaying an image. Such a display device generates an image to provide the generated image to the user through a display screen.

The display device includes a display panel that generates an image and an input sensor disposed on the display panel to sense an external input. The display panel includes a plurality of pixels that generate an image, and the input sensor includes a plurality of sensing electrodes for sensing the external input.

A flexible circuit board is connected to the display panel and the input sensor. First signal lines connected to the display panel and second signal lines connected to the input sensor are disposed on the flexible circuit board. First driving signals that drive the pixels are provided to the pixels through the first signal lines. Second driving signals that drive the sensing electrodes are provided to the sensing electrodes through some lines of the second signal lines. The signals sensed in the sensing electrodes are output through other lines of the second signal lines.

The above information disclosed in this Background section is only for understanding of the background of the inventive concepts, and, therefore, it may contain information that does not constitute prior art.

SUMMARY

Applicant has discovered that a display device having a display panel and an input sensor has a coupling phenomenon between signals applied to the display panel and signals applied to the input sensor such that the sensing quality of the input sensor and the display quality of the display panel are degraded by the noise caused by the coupling phenomenon.

Display devices constructed according to the principles and exemplary implementations of the invention are capable of reducing the noise caused by the coupling phenomenon between the signals applied to the display panel and signals applied to the input sensor. For example, display devices according to exemplary embodiments are capable of reducing the influence of the coupling phenomenon by using a differential signal method and by compensating the coupling phenomenon such that the sensing quality of the input sensor and the display quality of the display panel are improved.

Additional features of the inventive concepts will be set forth in the description which follows, and in part will be apparent from the description, or may be learned by practice of the inventive concepts.

According to an aspect of the invention, a display device includes: a display panel; an input sensor disposed on the display panel; a flexible circuit board connected to the display panel and the input sensor; a first differential signal line and a second differential signal line, which are disposed on the flexible circuit board and connected to the display panel; and a transmission line and a receiving line, which are disposed on the flexible circuit board and connected to the input sensor, wherein, in a plan view, the receiving line is disposed between the first differential signal line and the second differential signal line.

A first signal applied to the first differential signal line may have a phase opposite to that of a second signal applied to the second differential signal line.

The receiving line may be disposed on a first layer different from a second layer on which each of the first differential signal line and the second differential signal line may be disposed.

The receiving line partially may overlap the first differential signal line and the second differential signal line in a thickness direction of the flexible circuit board.

The receiving line, the first differential signal line, and the second differential signal line may be arranged in a first direction and extends in a second direction intersecting the first direction, and both sides of the receiving line, which are opposite to each other in the first direction, may overlap the first differential signal line and the second differential signal line in a thickness direction of the flexible circuit board.

In a plan view, a width of a first portion of the receiving line, which overlaps the first differential signal line, may be same as a width of a second portion of the receiving line, which overlaps the second differential signal line.

The receiving line may have a width greater than that of each of the first differential signal line and the second differential signal line in the first direction.

Each of the receiving line, the first differential signal line, and the second differential signal line may be provided in plurality, and a plurality of receiving lines may be arranged in constant intervals in the first direction.

A plurality of first differential signal lines and a plurality of second differential signal lines may be alternately disposed, and a k-th receiving line may be disposed between an h-th first differential signal line and an h-th second differential signal line, the 'k' and 'h' are natural numbers.

The transmission line may not overlap the first differential signal line and the second differential signal line in a thickness direction of the flexible circuit board.

The input sensor may include: a first sensing electrode connected to the transmission line; and a second sensing electrode connected to the receiving line, and wherein the display panel may include: a pixel; a gate line and a data line, which are connected to the pixel; and a data driver connected to the data line, the first differential signal line, and the second differential signal line.

The display device may further include a ground pattern disposed between a first layer on which the first and second differential signal lines are disposed and a second layer on which the receiving line is disposed.

In a plan view, the ground pattern may have a mesh shape.

The receiving line may not overlap the first differential signal line and the second differential signal line in a thickness direction of the flexible circuit board.

Both sides of the receiving line may overlap the first differential signal line and the second differential signal line in a thickness direction of the flexible circuit board, and in a plan view, a width of a first portion of the receiving line, which overlaps the first differential signal line, may be different from a width of a second portion of the receiving line, which overlaps the second differential signal line.

Each of the receiving line, the first differential signal line, and the second differential signal line may be provided in plurality, and a first distance between a k-th receiving line and a (k+1)-th receiving line of a plurality of receiving lines may be different from a second distance between the (k+1)-th receiving line and a (k+2)-th receiving line of the plurality of receiving lines, the 'k' is a natural number.

The display device may further include: a dummy receiving line disposed on the receiving line and connected to the receiving line; a first dummy differential line disposed on the first differential signal line and connected to the first differential signal line; and a second dummy differential line disposed on the second differential signal line and connected to the second differential signal line.

According to another aspect of the invention, a display device includes: a display panel; an input sensor disposed on the display panel; a flexible circuit board connected to the display panel and the input sensor; a first differential signal line and a second differential signal line, which are disposed on the flexible circuit board and connected to the display panel and to which signals having different phases are applied, respectively; and a receiving line disposed on a first layer different from a second layer, on which the first and second differential signal lines are disposed, on the flexible circuit board, the receiving line connected to the input sensor, wherein, in a plan view, the receiving line may be disposed between the first differential signal line and the second differential signal line.

The receiving line, the first differential signal line, and the second differential signal line may be arranged in a first direction and extends in a second direction intersecting the first direction, and both sides of the receiving line, which are opposite to each other in the first direction, may overlap the first differential signal line and the second differential signal line in a thickness direction of the flexible circuit board.

According to another aspect of the invention, a display device includes: a display panel; an input sensor disposed on the display panel; a flexible circuit board connected to the display panel and the input sensor; a plurality of differential signal lines disposed on the flexible circuit board and connected to the display panel; and a plurality of receiving lines disposed on the flexible circuit board and connected to the input sensor, wherein, in a plan view, a k-th receiving line is disposed between a j-th differential signal line and a (j+1)-th differential signal line, and a (k+1)-th receiving line is disposed between a (j+2)-th differential signal line and a (j+3)-th differential signal line, the 'j' and 'k' are natural numbers.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
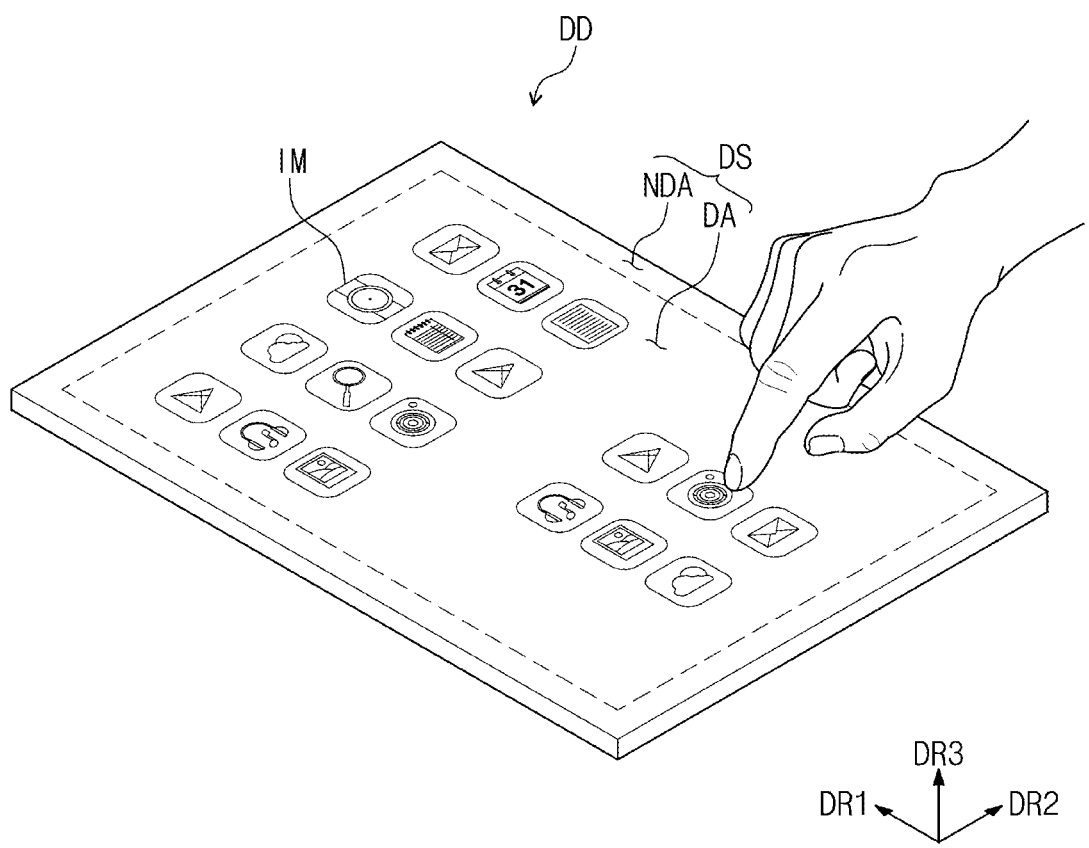
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments will be described in detail with reference to the accompanying drawings.

FIG. 1 is a perspective view of an exemplary embodiment of a display device constructed according to the principles of the invention.

Referring to FIG. 1, a display device DD according to an exemplary embodiment has a rectangular shape having long sides extending in a first direction DR1 and short sides extending in a second direction DR2 intersecting the first direction DR1. However, exemplary embodiments are not limited thereto. For example, the display device DD may have various shapes such as a circular shape or a polygonal shape.

Hereinafter, a direction that substantially perpendicularly crosses a plane defined by the first direction DR1 and the second direction DR2 is defined as a third direction DR3. Also, in this specification, the meaning when viewed in a plane is defined as a state viewed in the third direction D3.

A top surface of the display device DD may be defined as a display surface DS and have a plane defined by the first direction DR1 and the second direction DR2. Images IM generated from the display device DD may be provided to a user through the display surface DS.

The display surface DS may include a display area DA and a non-display area NDA around the display area DA. The images IM may be displayed on the display area DA, but may not be displayed on the non-display area NDA. The non-display area NDA may surround the display area DA and define an edge of the display device DD, which is formed of a predetermined color material.

The display device DD may be used for large-sized electronic devices such as televisions, monitors, or external billboards. Also, the electronic device ED may be used for small or medium-sized electronic devices such as personal computers, notebook computers, personal digital assistants, car navigation systems, game consoles, smart phones, tablet PCs, and cameras. However, the above-described devices are exemplified as merely exemplary embodiments, and thus, the display device DD may be adopted for other electronic devices.

Figure 2:
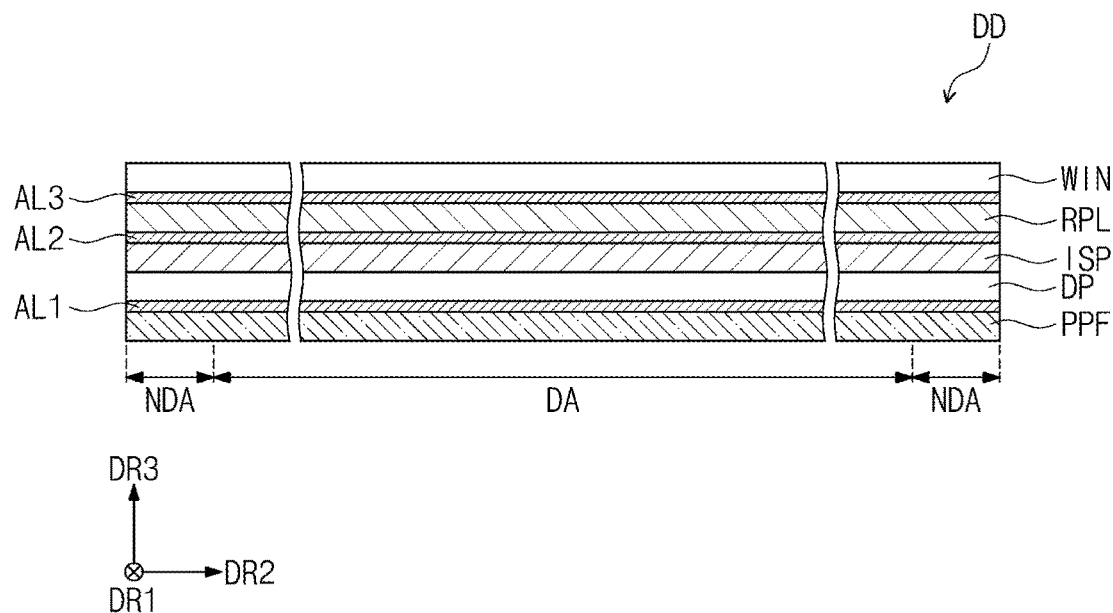
FIG. 2 is a cross-sectional view exemplarily illustrating the display device of FIG. 1.

FIG. 2 is a cross-sectional view exemplarily illustrating the display device of FIG. 1.

For example, FIG. 2 illustrates a cross-sectional view of the display device DD when viewed in the first direction DR1.

Referring to FIG. 2, the display device DD includes a display panel DP, an input sensor, which may be in the form of an input sensing part ISP, an anti-reflection layer RPL, a window WIN, a panel protective film PPF, and first, second, and third adhesive layers AL1, AL2, and AL3. The display panel DP may be a flexible display panel. For example, the display panel DP may include a plurality of electronic elements disposed on a flexible substrate.

The display panel DP according to an exemplary embodiment may be an emission type display panel, but exemplary embodiments are not limited thereto. For example, the display panel DP may be an organic light emitting display panel or a quantum dot light emitting display panel. An emission layer of the organic light emitting display panel may include an organic light emitting material. An emission layer of the quantum dot light emitting display panel may include a quantum dot, a quantum rod, and the like. Hereinafter, the display panel DP is described as an organic light emitting display panel.

The input sensing part ISP may be disposed on the display panel DP. The input sensing part ISP may include a plurality of sensing parts that sense an external input in a capacitive manner. The input sensing part ISP may be directly manufactured on the display panel DP when the display panel DP is manufactured. However, exemplary embodiments are not limited thereto, and the input sensing part ISP may be provided as a panel that is separated from the display panel DP and may be attached to the display panel DP by an adhesive layer.

The anti-reflection layer RPL may be disposed on the input sensing part ISP. The anti-reflection layer RPL may reduce reflectance of external light incident from the display device DD onto the display panel DP. For example, the anti-reflection layer RPL may include a phase retarder and/or a polarizer.

The window WIN may be disposed on the anti-reflection layer RPL. The window WIN may protect the display panel DP, the input sensing part ISP, and the anti-reflection layer RPL against external scratches and impacts.

The panel protective film PPF may be disposed under the display panel DP. The panel protective film PPF may protect a lower portion of the display panel DP. The panel protective film PPF may include a flexible plastic material such as polyethylene terephthalate (PET).

The first adhesive layer AL1 may be disposed between the display panel DP and the panel protective film PPF to bond the display panel DP and the panel protective film PPF to each other. The second adhesive layer AL2 may be disposed between the anti-reflection layer RPL and the input sensing part ISP to bond the anti-reflection layer RPL and the input sensing part ISP to each other. The third adhesive layer AL3 may be disposed between the window WIN and the anti-reflection layer RPL to bond the window WIN and the anti-reflection layer RPL to each other.

Figure 3:
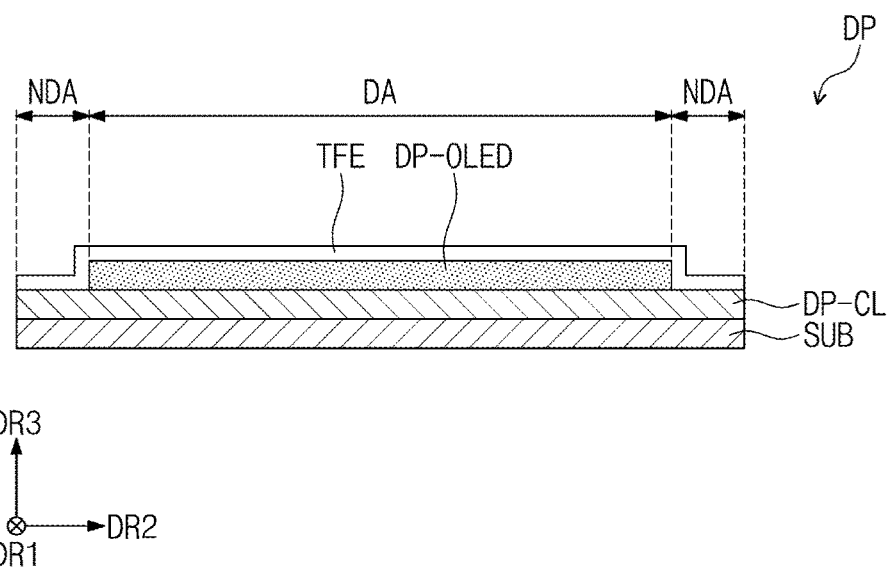
FIG. 3 is a cross-sectional view exemplarily illustrating a display panel of the display device of FIG. 2.

FIG. 3 is an exemplarily cross-sectional view illustrating the display panel of the display device of FIG. 2.

For example, FIG. 3 illustrates a cross-sectional view of the display panel DP when viewed in the first direction DR1.

Referring to FIG. 3, the display panel DP may include a substrate SUB, a circuit element layer DP-CL disposed on the substrate SUB, and a display element layer DP-OLED disposed on the circuit element layer DP-CL, and a thin film encapsulation layer TFE disposed on the display element layer DP-OLED.

The substrate SUB may include a display area DA and a non-display area NDA around the display area DA. The display element layer DP-OLED may be disposed on the display area DA. The substrate SUB may include a flexible plastic material such as polyimide (PI).

A plurality of pixels may be disposed on the circuit element layer DP-CL and the display element layer DP-OLED. Each of the pixels may include a transistor disposed on the circuit element layer DP-CL and a light emitting element disposed on the display element layer DP-OLED and connected to the transistor. Hereinafter, constituents of the pixel will be described in detail.

The thin film encapsulation layer TFE may cover the display element layer DP-OLED. The thin film encapsulation layer TFE may include an inorganic layer, an organic layer, and an inorganic layer, which are sequentially laminated. Each of the inorganic layers may include an inorganic material and protect the pixels against moisture or oxygen. The organic layer includes an organic material and protect the pixels against foreign substances such as dust particles.

Figure 4:
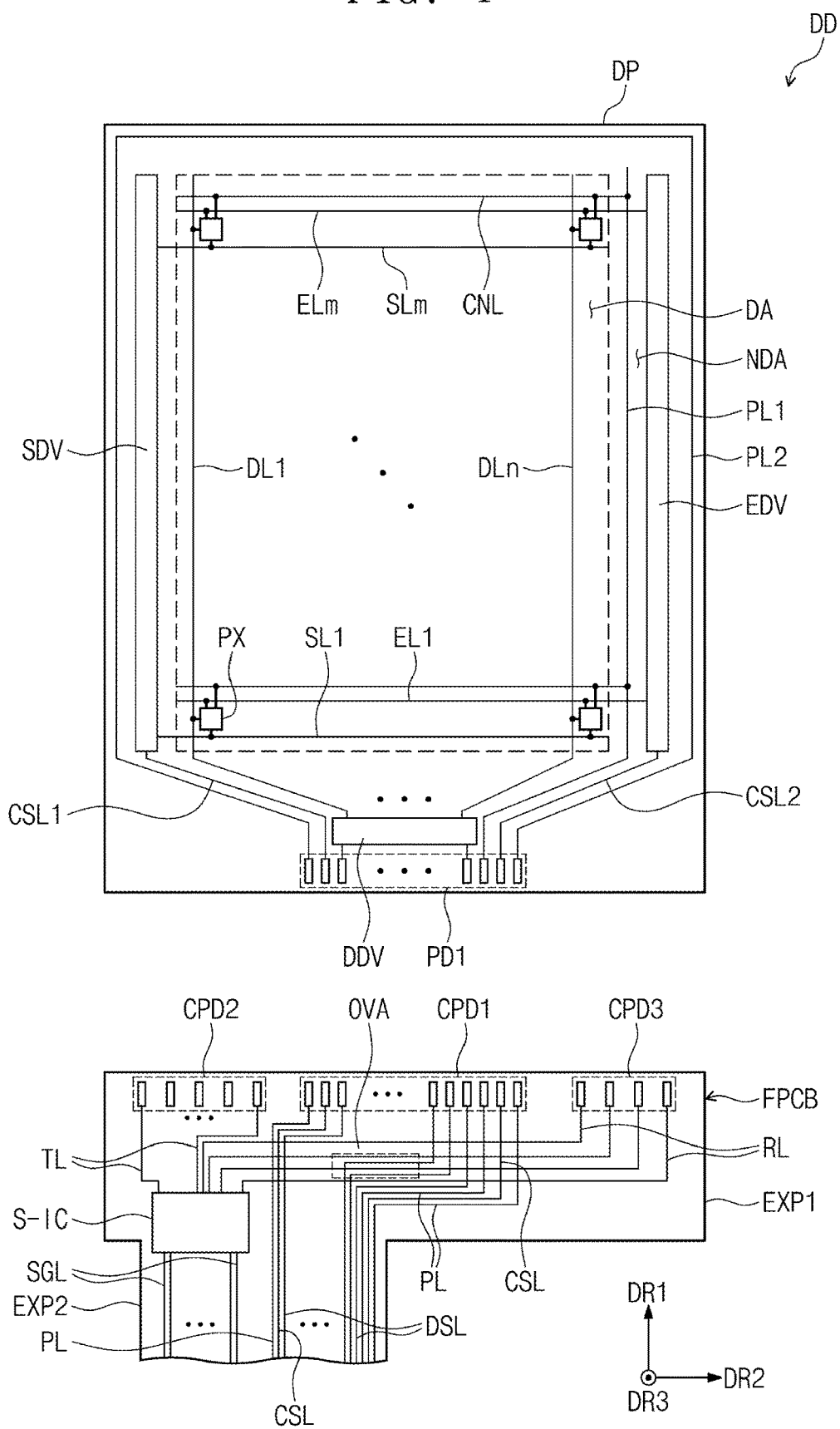
FIG. 4 is a plan view of the display panel of FIG. 3.

FIG. 4 is a plan view of the display panel of FIG. 3.

Referring to FIG. 4, the display device DD includes a display panel DP, a scan driver SDV, a data driver DDV, an emission driver EDV, and a plurality of first pads PD1, a flexible circuit board FPCB, a sensing control unit S-IC, a plurality of first connection pads CPD1, a plurality of second connection pads CPD2, and a plurality of thirds connection pads CPD3.

The display panel DP may have a rectangular shape having long sides extending in the first direction DR1 and short sides extending in the second direction DR2, but the shape of the display panel DP is not limited thereto. The display panel DP may include a display area DA and a non-display area NDA surrounding the display area DA.

The display panel DP includes a plurality of pixels PX, a plurality of scan lines SL1 to SLm, a plurality of data lines DL1 to DLn, a plurality of emission lines EL1 to ELm, first and second control lines CSL1 and CSL2, first and second power lines PL1 and PL2, and power connection lines CNL. Here, 'm' and 'n' are natural numbers.

The pixels PX may be disposed on the display area DA. The scan driver SDV and the data driver DDV may be disposed on the non-display areas that are adjacent to the long sides of the display panel DP, respectively. The data driver DDV may be disposed on the non-display area NDA adjacent to one short side of the short sides of the display panel DP. When viewed in a plane (e.g., in a plan view), the data driver DDV may be adjacent to a lower end of the display panel DP. The data driver DDV may be manufactured in the form of an integrated circuit chip and mounted on the display panel DP.

The scan lines SL1 to SLm may extend in the second direction DR2 and be connected to the pixels PX and the scan driver SDV. The data lines DL1 to DLn may extend in the first direction DR1 and be connected to the pixels PX and the data driver DDV. The emission lines EL1 to ELm may extend in the second direction DR2 and be connected to the pixels PX and the emission driver EDV.

The first power line PL1 may extend in the first direction DR1 and be disposed on the non-display area NDA. The first power line PL1 may be disposed between the display area DA and the emission driver EDV, but exemplary embodiments are not limited thereto. For example, the first power line PL1 may be disposed between the display area DA and the scan driver SDV.

The power connection lines CNL may extend in the second direction DR2 and be arranged in the first direction DR1. The power connection lines CNL may be connected to the first power line PL1 and the pixels PX. A first voltage may be applied to the pixels PX through the first power line PL1 and the power connection lines CNL, which are connected to each other.

The second power line PL2 may be disposed on the non-display area NDA. The second power line PL2 may extend along the long sides of the display panel DP and another short side of the display panel DP on which the data driver DDV is not disposed. The second power line PL2 may be disposed outside the scan driver SDV and the emission driver EDV.

The second power line PL2 may extend toward the display area DA and be connected to the pixels PX. A second voltage having a level less than that of the first voltage may be applied to the pixels PX through the second power line PL2.

The first control line CSL1 may be connected to the scan driver SDV, and in a plan view, the first control line CSL1 may extend toward the lower end of the display panel DP. The second control line CSL2 may be connected to the emission driver EDV, and in a plan view, the second control line CSL2 may extend toward the lower end of the display panel DP. The data driver DDV may be disposed between the first control line CSL1 and the second control line CSL2, e.g., in the second direction DR2.

The first pads PD1 may be disposed on the display panel DP. The first pads PD1 may be closer to the lower end of the display panel DP than the data driver DDV. The data driver DDV, the first power line PL1, the second power line PL2, the first control line CSL1, and the second control line CSL2 may be connected to the first pads PD. The data lines DL1 to DLn may be connected to the data driver DDV, and the data driver DDV may be connected to the first pads PD, which correspond to the data lines DL1 to DLn.

The flexible circuit board FPCB may be implemented as a flexible circuit board, but exemplary embodiments are not limited thereto. For example, the flexible circuit board FPCB may be implemented as a rigid type. The sensing control unit S-IC may be manufactured in the form of an integrated circuit chip and mounted on the flexible circuit board FPCB.

The first connection pads CPD1, the second connection pads CPD2, and the third connection pads CPD3 may be disposed on the flexible circuit board FPCB. In a plan view, the first connection pads CPD1, the second connection pads CPD2, and the third connection pads CPD3 may be adjacent to an upper end of the flexible circuit board FPCB. The upper end of the flexible circuit board FPCB may face the lower end of the display panel DP.

The first connection pads CPD1 may be disposed between the second connection pads CPD2 and the third connection pads CPD3, e.g., in the second direction DR2. For example, the second connection pads CPD2 may be disposed at left sides of the first connection pads CPD1, and the third connection pads CPD3 may be disposed at right sides of the first connection pads CPD1.

The flexible circuit board FPCB may be connected to the display panel DP. For example, since the first connection pads CPD1 are connected to the first pads PD1, the flexible circuit board FPCB may be connected to the display panel DP.

The flexible circuit board FPCB may include a first extension part EXP1 extending in the second direction DR2 and a second extension part EXP2 extending in the first direction DR1 from a predetermined portion of the first extension part EXP1. The second extension part EXP2 may extend in a direction away from the display panel DP (e.g., in the first direction DR1).

The sensing control unit S-IC may be disposed on the first extension part EXP1. The sensing control unit S-IC may be adjacent to the second extension part EXP2. The first connection pads CPD1, the second connection pads CPD2, and the third connection pads CPD3 may be disposed on the first extension part EXP1, and in a plan view, The first connection pads CPD1, the second connection pads CPD2, and the third connection pads CPD3 may be adjacent to an upper end of the first extension part EXP1.

A plurality of signal lines SGL, a plurality of transmission lines TL, a plurality of receiving lines RL, a plurality of differential signal lines DSL, a plurality of power lines PL, and a plurality of control lines CSL may be disposed within the flexible circuit board FPCB.

The signal lines SGL, the differential signal lines DSL, the power lines PL, and the control lines CSL may be disposed on the second extension part EXP2 to extend in the first direction DR1. The second extension part EXP2 may be connected to a system board disposed at the outside. The signal lines SGL, the differential signal lines DSL, the power lines PL, and the control lines CSL may be connected to the system board through the second extension part EXP2. The system board may control an overall operation of the display device DD.

The signal lines SGL may extend in the first direction DR1 so as to be connected to the sensing control unit S-IC in the first extension part EXP1. The transmission lines TL and the receiving lines RL may be disposed on the first extension part EXP1 and connected to the sensing control unit S-IC.

The transmission lines TL may extend in the first direction DR1, the second direction DR2, and the first direction DR1 so as to be connected to the second connection pads CPD2. The transmission lines TL may extend sequentially in the first direction DR1, the second direction DR2, and the first direction DR1. The receiving lines RL may extend in the first direction DR1, the second direction DR2, and the first direction DR1 so as to be connected to the third connection pads CPD3. The receiving lines RL may extend sequentially in the first direction DR1, the second direction DR2, and the first direction DR1

The differential signal lines DSL, the power lines PL, and the control lines CSL may extend in the first direction DR1, the second direction DR2, and the first direction DR1 from the first extension part EXP1 so as to be connected to the first connection pads CPD1. The differential signal lines DSL, the power lines PL, and the control lines CSL may be connected to the first pads PD1 through the first connection pads CPD1 so as to be connected to the display panel DP.

The receiving lines RL extending in the second direction DR2 may overlap the differential signal lines DSL extending in the second direction DR2. For example, four receiving lines RL extending through an overlapping area OVA are illustrated in FIG. 4. However, exemplary embodiments are not limited thereto. For example, the greater number of receiving lines RL may be provided. The configuration of the receiving lines RL and the differential signal lines DSL, which overlap each other, will be described in detail below in FIG. 10 in which the overlapping area OVA illustrated in FIG. 4 is enlarged. The transmission lines TL may not overlap the differential signal lines DSL.

The system board may include a timing controller for controlling the operation of the display panel DP. The second extension part EXP2 may be connected to a voltage generation part disposed at the outside. The timing controller may output a scan control signal, image signals, and emission control signals. The voltage generation part may generate the first voltage and the second voltage.

The scan control signal and the emission control signal may be provided to the first control line CSL1 and the second control line CSL2 through the control lines CSL, respectively. The scan control signal may be provided to the scan driver SDV through the first control line CSL1. The emission control signal may be provided to the emission driver EDV through the second control line CSL2. The image signals may be provided to the data driver DDV through the differential signal lines DSL.

The scan driver SDV may generate a plurality of scan signals in response to the scan control signal, and the scan signals may be applied to the pixels PX through the scan lines SL1 to SLm. The emission driver EDV may generate a plurality of emission control signals in response to the emission control signal, and the emission control signals may be applied to the pixels PX through the emission lines EL1 to ELm.

The data driver DDV may generate a plurality of data voltages corresponding to the image signals. The data voltages may be provided to the pixels PX through the data lines DL1 to DLn. The first voltage and the second voltage may be provided to the first power line PL1 and the second power line PL2 in the display panel DP through the power lines PL in the flexible circuit board FPCB.

The pixels PX may receive the data voltages in response to the scan signals. The pixels PX may emit light having luminance corresponding the data voltages in response to the emission control signals to display an image. An emission time of the pixels PX may be controlled by the emission control signals.

The sensing control unit S-IC may be connected to the sensing electrodes of the input sensing part ISP to be described below through the second connection pads CPD2 and the third connection pads CPD3. An operation of the sensing control unit S-IC will be described below with the input sensing part ISP illustrated in FIG. 6.

Figure 5:
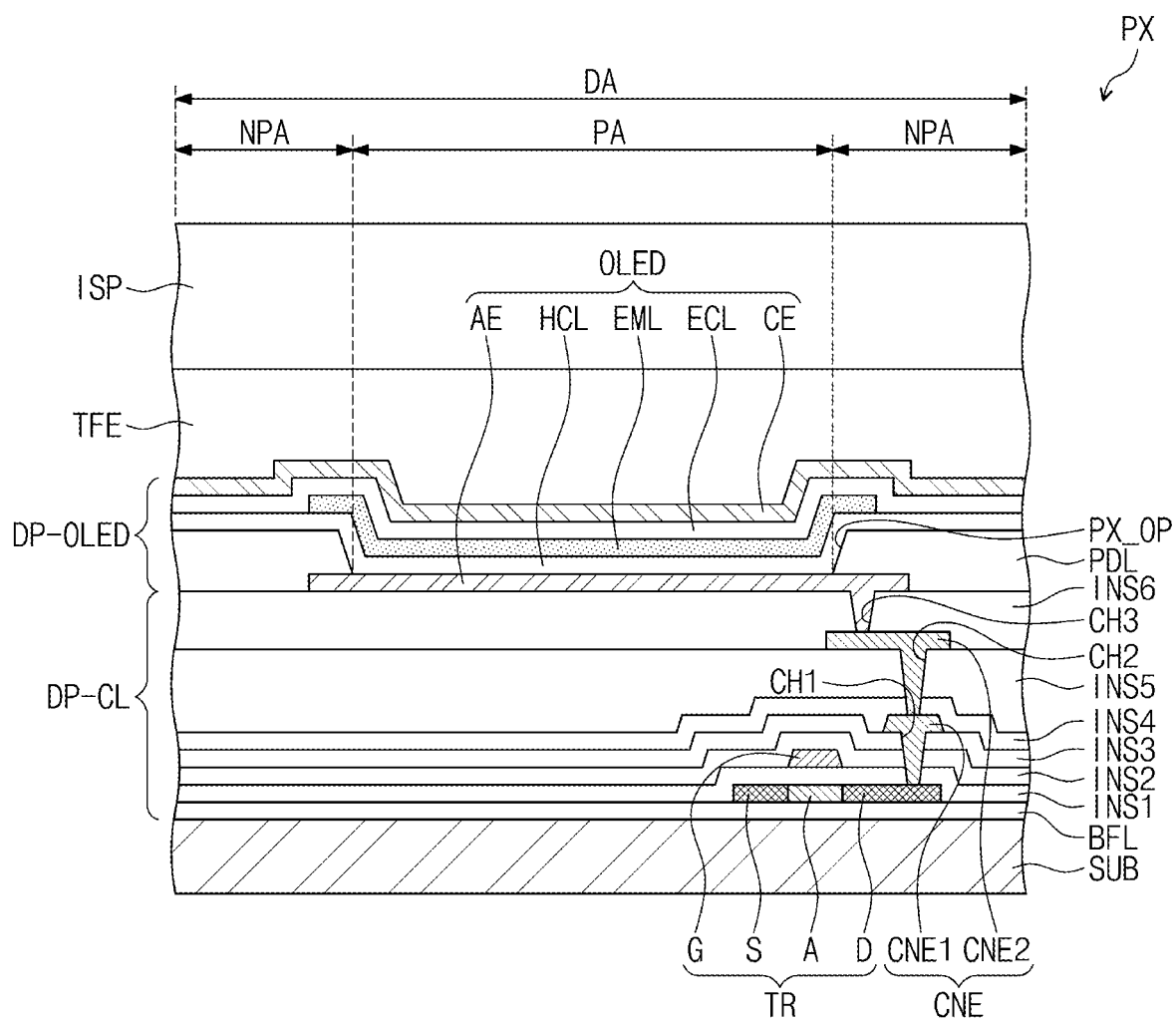
FIG. 5 is a cross-sectional view exemplarily illustrating a representative pixel of FIG. 4.

FIG. 5 is a cross-sectional view exemplarily illustrating a representative pixel of FIG. 4.

Referring to FIG. 5, the pixel PX may include a transistor TR and a light emitting element OLED. The light emitting element OLED may include a first electrode AE, a second electrode CE, a hole control layer HCL, an electron control layer ECL, and an emission layer EML. The first electrode AE may be an anode electrode, and the second electrode CE may be a cathode electrode.

The transistor TR and the light emitting element OLED may be disposed on the substrate SUB. For example, one transistor TR is illustrated, but substantially, the pixel PX may include a plurality of transistors and at least one capacitor for driving the light emitting element OLED.

The display area DA may include an emission area PA corresponding to each of the pixels PX and a non-emission area NPA around the emission area PA. The light emitting element OLED may be disposed on the emission area PA.

A buffer layer BFL may be disposed on the substrate SUB, and the buffer layer BFL may be an inorganic layer. A semiconductor pattern may be disposed on the buffer layer BFL. The semiconductor pattern may include polysilicon. However, exemplary embodiments are not limited thereto, and the semiconductor pattern may include amorphous silicon or metal oxide.

Electrical properties of the semiconductor pattern may vary according to whether doping is performed. The semiconductor pattern may include a doped region and a non-doped region. The doped region may be doped with an N-type dopant or a P-type dopant. The doped region may have conductivity greater than that of the non-doped region to substantially serve as a source region and a drain region of the transistor TR. The non-doped region may substantially correspond to an active region (e.g., channel) of the transistor.

A source region S, an active region A, and a drain region D of the transistor TR may be formed from the semiconductor pattern. A first insulating layer INS1 may be disposed on the semiconductor pattern. The gate electrode G of the transistor TR may be disposed on the first insulating layer INS1. A second insulating layer INS2 may be disposed on the gate electrode G. A third insulating layer INS3 may be disposed on the second insulating layer INS2.

The connection electrode CNE may be disposed between the transistor TR and the light emitting element OLED to connect the transistor TR to the light emitting element OLED. The connection electrode CNE may include a first connection electrode CNE1 and a second connection electrode CNE2.

The first connection electrode CNE1 may be disposed on the third insulating layer INS3 and be connected to the drain region D through a first contact hole CH1 defined in the first, second, and third insulating layers INS1, INS2, and INS3. A fourth insulating layer INS4 may be disposed on the first connection electrode CNE1. A fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through a second contact hole CH2 defined in the fifth insulating layer INS5.

A sixth insulating layer INS6 may be disposed on the second connection electrode CNE2. A layer provided from the buffer layer BFL to the sixth insulating layer INS6 may be defined as the circuit element layer DP-CL. Each of the first insulating layer INS1 to the sixth insulating layer INS6 may be an inorganic layer or an organic layer.

The first electrode AE may be disposed on the sixth insulating layer INS6. The first electrode AE may be connected to the second connection electrode CNE2 through a third contact hole CH3 defined in the sixth insulating layer INS6. A pixel defining layer PDL exposing a predetermined portion of the first electrode AE may be disposed on the first electrode AE and the sixth insulating layer INS6. An opening PX_OP through which a predetermined portion of the first electrode AE is exposed may be defined in the pixel defining layer PDL.

The hole control layer HCL may be disposed on the first electrode AE and the pixel defining layer PDL. The hole control layer HCL may be commonly disposed on the emission area PA and the non-emission area NPA. The hole control layer HCL may include a hole transport layer and a hole injection layer.

The emission layer EML may be disposed on the hole control layer HCL. The emission layer EML may be disposed on an area corresponding to the opening PX_OP. The emission layer EML may include an organic material and/or an inorganic material. The emission layer EML may emit one of a red light, a green light, and a blue light.

The electronic control layer ECL may be disposed on the hole control layer HCL to cover the emission layer EML. The hole control layer HCL may be commonly disposed on the emission area PA and the non-emission area NPA. The charge control layer OL may include an electron transport layer and an electron injection layer.

The second electrode CE may be disposed on the electronic control layer ECL. The second electrode CE may be commonly disposed in the pixels PX. The layer on which the light emitting element OLED is disposed may be defined as the display element layer DP-OLED. The thin film encapsulation layer TFE may be disposed on the light emitting element OLED. The input sensing part ISP may be disposed on the thin film encapsulation layer TFE.

The first voltage may be applied to the first electrode AE through the transistor TR, and the second voltage may be applied to the second electrode CE. Holes and electrons injected into the light emitting layer EML may be coupled to each other to form exciton. While the exciton may be transitioned to a ground state, the light emitting element OLED may emit light.

Figure 6:
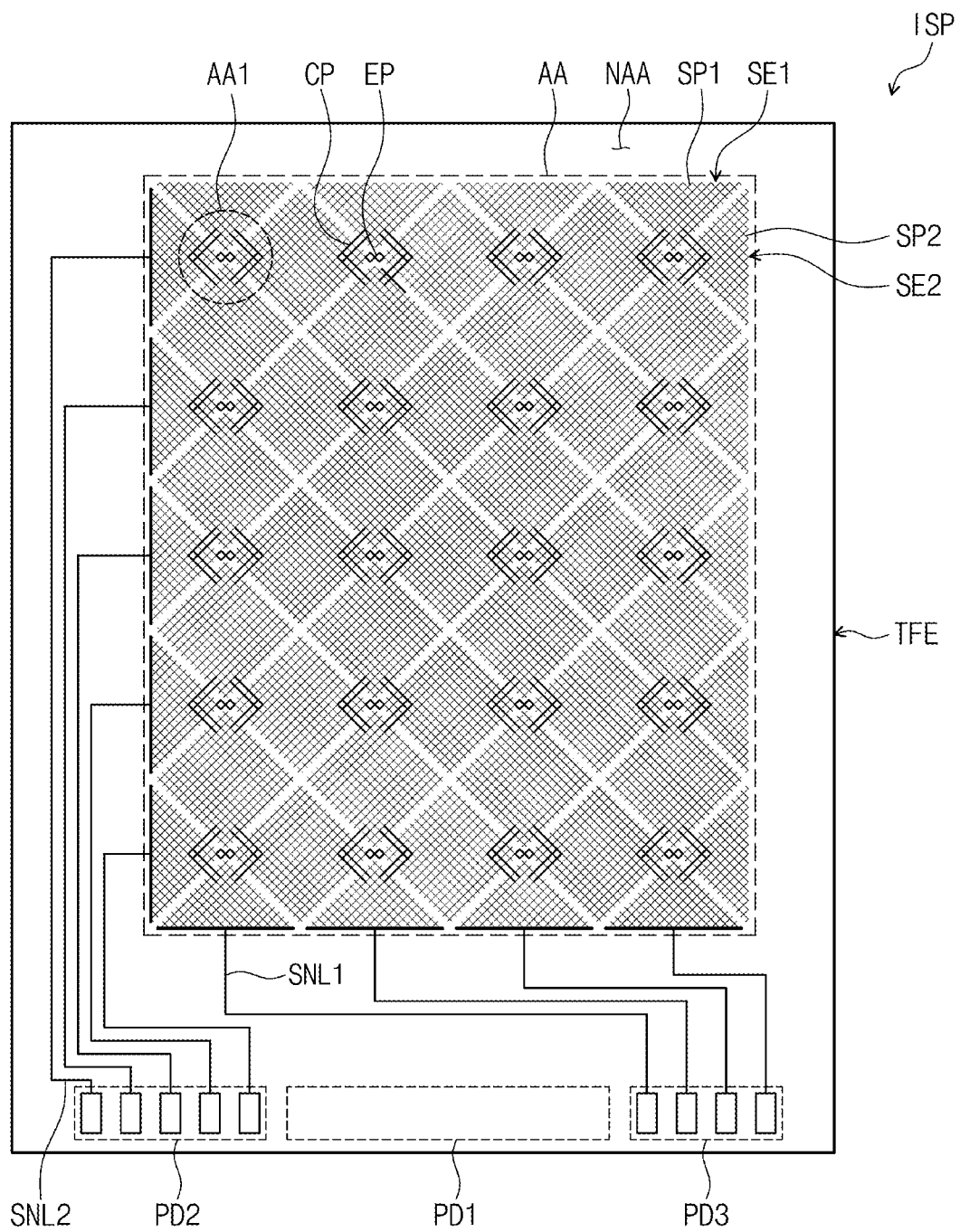
FIG. 6 is a plan view of an input sensing part of the display device of FIG. 2.

FIG. 6 is a plan view of the input sensing part of the display device of FIG. 2.

Hereinafter, the configuration of the flexible circuit board FPCB illustrated in FIG. 4 will be described together.

Referring to FIGS. 4 and 6, the input sensing part ISP may include a plurality of sensing electrodes SE1 and SE2, a plurality of sensing lines SNL1 and SNL2, a plurality of second pads PD2, and a plurality of third pads PD3. The sensing electrodes SE1 and SE2, the sensing lines SNL1 and SNL2, the second pads PD2, and the third pads PD3 may be disposed on the thin film encapsulation layer TFE.

A planar area of the input sensing part ISP may include an active area AA and a non-active area NAA around the active area AA. The active area AA may overlap the display area DA, and the non-active area NAA may overlap the non-display area NDA. The sensing electrodes SE1 and SE2 may be disposed on the active area AA, and the second pads PD2 and the third pads PD3 may be disposed on the non-active area NAA.

The sensing lines SNL1 and SNL2 may be connected to ends of the sensing electrodes SE1 and SE2 to extend to the non-active area NAA so as to be connected to the second pads PD2 and the third pads PD3. The input sensing part ISP may be connected to the flexible circuit board FPCB. For example, the second pads PD2 may be connected to the second connection pads CPD2 disposed on the flexible circuit board FPCB, and the third pads PD3 may be connected to the third connection pads CPD3 disposed on the flexible circuit board FPCB.

The transmission lines TL may be connected to the input sensing part ISP through the second connection pads CPD2. The receiving lines RL may be connected to the input sensing part ISP through the third connection pads CPD3.

The sensing electrodes SE1 and SE2 includes a plurality of first sensing electrodes SE1 extending in the first direction DR1 and arranged in the second direction DR2 and a plurality of second sensing electrodes SE2 extending in the second direction DR2 and arranged in the first direction DR1. The second sensing electrodes SE2 may be insulated from the first sensing electrodes SE1 to extend to cross or overlap each other.

The sensing lines SNL1 and SNL2 may include a plurality of first sensing lines SNL1 connected to the first sensing electrodes SE1 and a plurality of second sensing lines SNL2 connected to the second sensing electrodes SE2. The first sensing lines SNL1 may be connected to the third pads PD3. The second sensing lines SNL2 may be connected to the second pads PD2. Thus, the transmission lines TL may be connected to the second sensing lines SNL2, and the receiving lines RL may be connected to the first sensing lines SNL1.

The first sensing electrodes SE1 may be defined as output sensing electrodes, and the second sensing electrodes SE2 may be defined as input sensing electrodes. The input sensing part ISP may be driven in a mutual sensing mode. For example, the sensing control unit S-IC may provide driving signals to the input sensing part ISP and receive sensing signals from the input sensing part ISP.

The driving signals may be applied to the second sensing electrodes SE2 through the transmission lines TL and the second sensing lines SNL2. The sensing signals sensed in the first sensing electrodes SE1 may be output through the first sensing lines SNL1 and may be provided to the sensing control unit S-IC through the receiving lines RL.

The sensing control unit S-IC may receive control signals for generating driving signals through the signal lines SGL. Also, the sensing control unit S-IC may process the sensing signals to output the processed sensing signal through the signal lines SGL.

Each of the first sensing electrodes SE1 may include a plurality of first sensing parts SP1 arranged in the first direction DR1 and a plurality of connection patterns CP connecting the first sensing parts SP1 to each other. Each of the connection patterns CP may be disposed between two first sensing parts SP1 adjacent to each other in the first direction DR1 to connect the two first sensing parts SP1 to each other.

Each of the second sensing electrodes SE2 may include a plurality of second sensing parts SP2 arranged in the second direction DR2 and a plurality of extension patterns EP extending from the second sensing parts SP2. Each of the extension patterns EP may be disposed between two second sensing parts SP2 adjacent to each other in the second direction DR2 to extend from the two second sensing parts SP2.

The first sensing parts SP1 and the second sensing parts SP2 may have a mesh shape. The first sensing parts SP1 and the second sensing parts SP2 may not overlap each other and be spaced apart from each other so as to be alternately arranged with respect to each other. Each of the first sensing parts SP1 and the second sensing parts SP2 may have electrostatic capacity. The extension patterns EP may not overlap the connection patterns CP.

The first and second sensing parts SP1 and SP2 and the extension patterns EP may be disposed on the same layer. The connection patterns CP may be disposed on a layer that is different from layers on which the first and second sensing parts SP1 and SP2 and the extension patterns EP are disposed.

Figure 7:
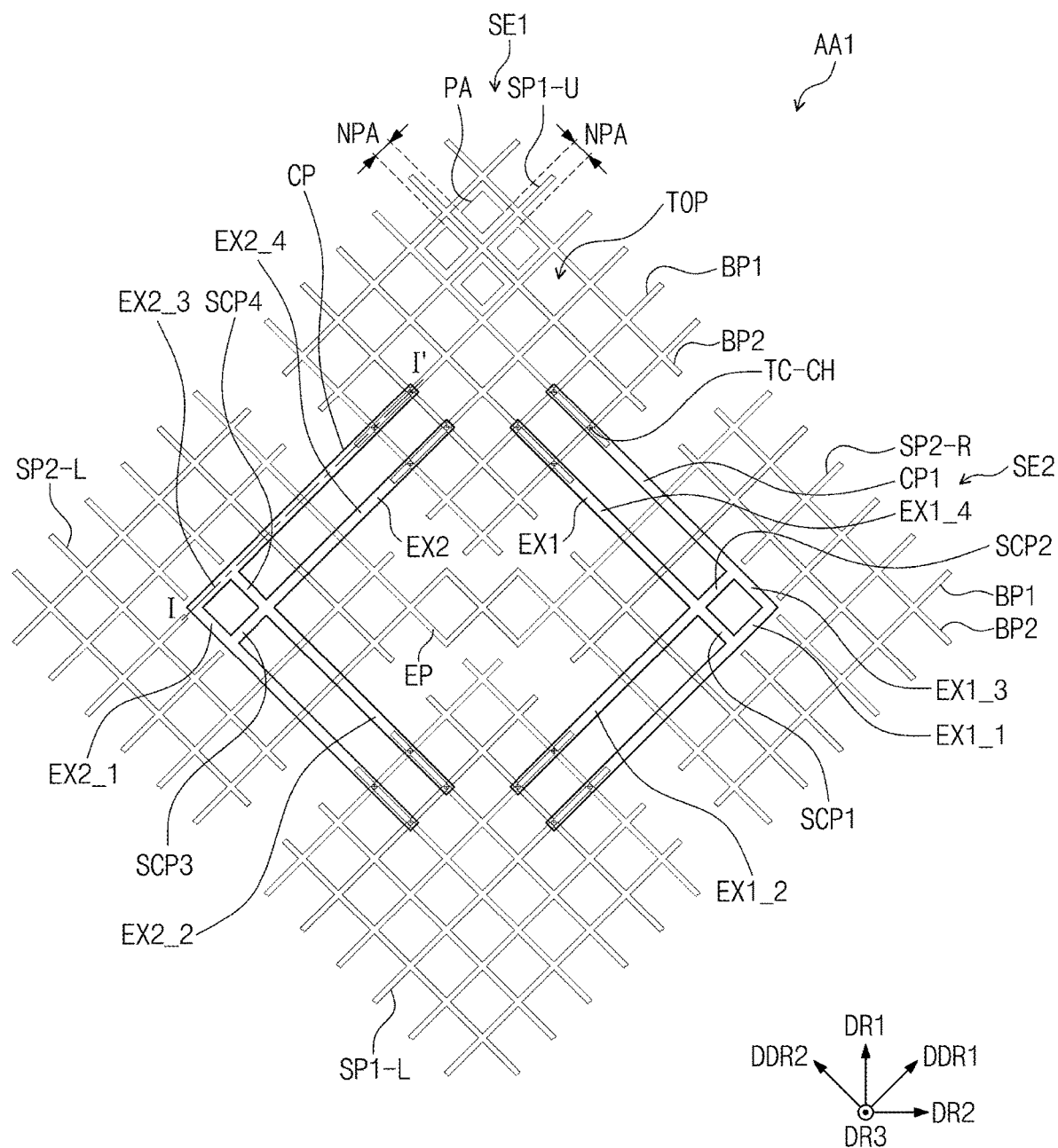
FIG. 7 is an enlarged view of an area AA1 of FIG. 6.

FIG. 7 is an enlarged view of an area AA1 of FIG. 6.

Referring to FIG. 7, each of the first and second sensing parts SP1 and SP2 may include a plurality of first branch parts BP1 extending in a first diagonal direction DDR1 and a plurality of second branch parts BP2 extending in a second diagonal direction DDR2 so as to provide a mesh shape.

The first diagonal direction DDR1 may be defined as a direction intersecting the first and second directions DR1 and DR2 on a plane defined by the first and second directions DR1 and DR2. The second diagonal direction DDR2 may be defined as a direction intersecting the first diagonal direction DDR1 on the plane defined by the first and second directions DR1 and DR2.

The first branch parts BP1 and the second branch parts BP2 of the first and second sensing parts SP1 and SP2 may cross each other and may be integrated with each other. Rhombus-shaped touch openings TOP may be defined by the first branch parts BP1 and the second branch parts BP2.

When viewed in a plane, the emission areas PA may be disposed in the touch openings TOP. Each of the emission areas PA may be the emission area illustrated in FIG. 5. For example, four emission areas PA disposed on one first sensing part SP1 are illustrated, but substantially, a plurality of emission areas PA may be disposed in the touch openings TOP.

For example, each of the emission areas PA may have a rhombus shape, but exemplary embodiments are not limited thereto. The first and second branch parts BP1 and BP2 may overlap the non-emission area NPA.

The connection pattern CP may extend so as not to overlap the extension pattern EP, thereby connecting the first sensing parts SP1 to each other. The connection pattern CP may be connected to the first sensing parts SP1 through a plurality of contact holes TC-CH. The connection pattern CP may extend toward the first sensing parts SP1 through the second sensing parts SP2.

The extension pattern EP may be disposed between the first sensing parts SP1 to extend from the second sensing parts SP2. The second sensing parts SP2 and the extension pattern EP may be integrated with each other. The extension pattern EP may have a mesh shape. The extension pattern EP, the first sensing parts SP1, and the second sensing parts SP2 may be formed by simultaneously patterning the same material.

The connection pattern CP may include a first extension part EX1 and a second extension part EX2 having a shape that is symmetrical to the first extension part EX1. The extension pattern EP may be disposed between the first extension part EX1 and the second extension part EX2. The first extension part EX1 may extend through an area overlapping one second sensing part SP2 (e.g., a right one) of the second sensing parts SP2 and be connected to the first sensing parts SP1. The second extension part EX2 may extend through an area overlapping the other second sensing part SP2 (e.g., a left one) of the second sensing parts SP2 and be connected to the first sensing parts SP1.

Hereinafter, the first sensing parts SP1 may be defined as an upper first sensing part SP1_U and a lower first sensing part SP1_L according to a relative arrangement position.

Also, the second sensing parts SP2 may be defined as a left second sensing part SP2_L and a right second sensing part SP2_R according to a relative arrangement position.

Portions of the first and second extension parts EX1 and EX2, which are adjacent to sides of the first and second extension parts EX1 and EX2, may be connected to the first sensing part SP1 through the contact holes TC-CH. Portions of the first and second extension parts EX1 and EX2, which are adjacent to the other sides of the first and second extension parts EX1 and EX2, may be connected to the upper first sensing part SP1_U through the contact holes TC-CH. The structure of the contact holes TC-CH will be illustrated in FIG. 8 below.

The first extension part EX1 may include first and second sub extension parts EX1_1 and EX1_2 extending in the first diagonal direction DDR1, third and fourth sub extension parts EX1_3 and EX1_4 extending in the second diagonal direction DDR2, a first sub conductive pattern SCP1 extending in the second diagonal direction DDR2, and a second sub conductive pattern SCP2 extending in the first diagonal direction DDR1.

Portions of the first and second sub extension parts EX1_1 and EX1_2 adjacent to sides of the first and second sub extension parts EX1_1 and EX1_2 may be connected to the lower first sensing part SP1_L through the contact holes TC-CH. Portions of the third and fourth sub extension parts EX1_3 and EX1_4 adjacent to sides of the third and fourth sub extension parts EX1_3 and EX1_4 may be connected to the upper first sensing part SP1_U through the contact holes TC-CH.

The other side of the first sub extension part EX1_1 may extend from the other side of the third sub extension part EX1_3, and the second sub extension part EX1_2 may extend from the other side of the fourth sub extension part EX1_4. The first sub conductive pattern SCP1 may extend from the other side of the fourth sub extension part EX1_4 in the second diagonal direction DDR2 and extend to the first sub extension part EX1_1. The second sub conductive pattern SCP2 may extend from the other side of the second sub extension part EX1_2 in the first diagonal direction DDR1 and extend to the third sub extension part EX1_3.

The first sub extension part EX1_1, the second sub extension part EX1_2, the third sub extension part EX1_3, the fourth sub extension part EX1_4, the first sub conductive pattern SCP1, and the second sub conductive pattern SCP2 may be integrated with each other.

The first and second sub extension parts EX1_1 and EX1_2 may extend to cross or overlap a predetermined number (e.g., two) of the second branch parts BP2 of the right second sensing part SP2_R, which are adjacent to the lower first sensing part SP1_L. The first branch parts BP1 of the right second sensing part SP2_R may not be disposed on some areas overlapping the first and second sub extension parts EX1_1 and EX1_2 and the second sub conductive pattern SCP2.

The third and fourth sub extension parts EX1_3 and EX1_4 may extend to cross or overlap a predetermined number (e.g., two) of the first branch parts BP1 of the right second sensing part SP2_R, which is adjacent to the upper first sensing part SP1_U. The second branch parts BP2 of the right second sensing part SP2_R may not be disposed on some areas overlapping the third and fourth sub extension parts EX1_3 and EX1_4 and the first sub conductive pattern SCP1.

The second extension part EX2 may include fifth and sixth sub extension parts EX2_1 and EX2_2 extending in the second diagonal direction DDR2, seventh and eighth sub extension parts EX2_3 and EX2_4 extending in the first diagonal direction DDR1, a third sub conductive pattern SCP3 extending in the first diagonal direction DDR1, and a fourth sub conductive pattern SCP4 extending in the second diagonal direction DDR2.

The left second sensing part SP2_L may have a structure that is symmetrical to the right second sensing part SP2_R, and the second extension part EX2 may have a structure that is symmetrical to the first extension part EX1. Therefore, hereinafter, descriptions of the fifth to eighth sub extension parts EX2_1 to EX2_4 and the third and fourth sub conductive patterns SCP3 and SCP4 will be omitted for descriptive convenience.

Figure 8:
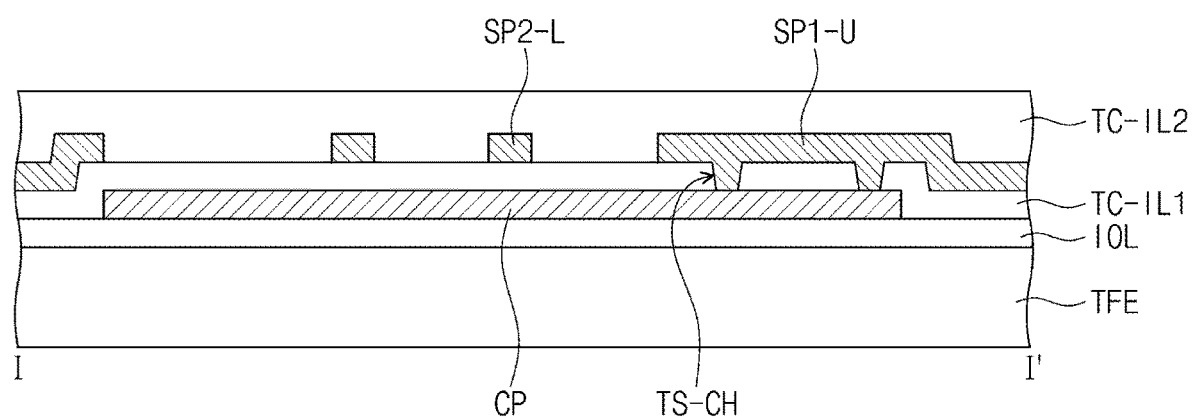
FIG. 8 is a cross-sectional view taken along line I-I' of FIG. 7.

FIG. 8 is a cross-sectional view taken along line I-I' of FIG. 7.

Referring to FIG. 8, an insulating layer IOL may be disposed on the thin film encapsulation layer TFE. The insulating layer IOL may be an inorganic layer. The connection pattern CP may be disposed on the insulating layer IOL. The first insulating layer TC-OL1 may be disposed on the connection pattern CP and the insulating layer IOL. The first insulating layer TC-OL1 may be an inorganic layer or an organic layer.

The first sensing parts SP1 and the second sensing parts SP2 may be disposed on the first insulating layer TC-OL1. The extension pattern EP integrated with the second sensing parts SP2 may also be disposed on the first insulating layer TC-OL1.

The connection pattern CP may be connected to the first sensing parts SP1 through contact holes TC-CH defined in the first insulating layer TC-OL1. The second insulating layer TC-OL2 may be disposed on the first insulating layer TC-OL1 to cover the first sensing parts SP1 and the second sensing parts SP2. The second insulating layer TC-OL2 may be an organic layer.

Figure 9:
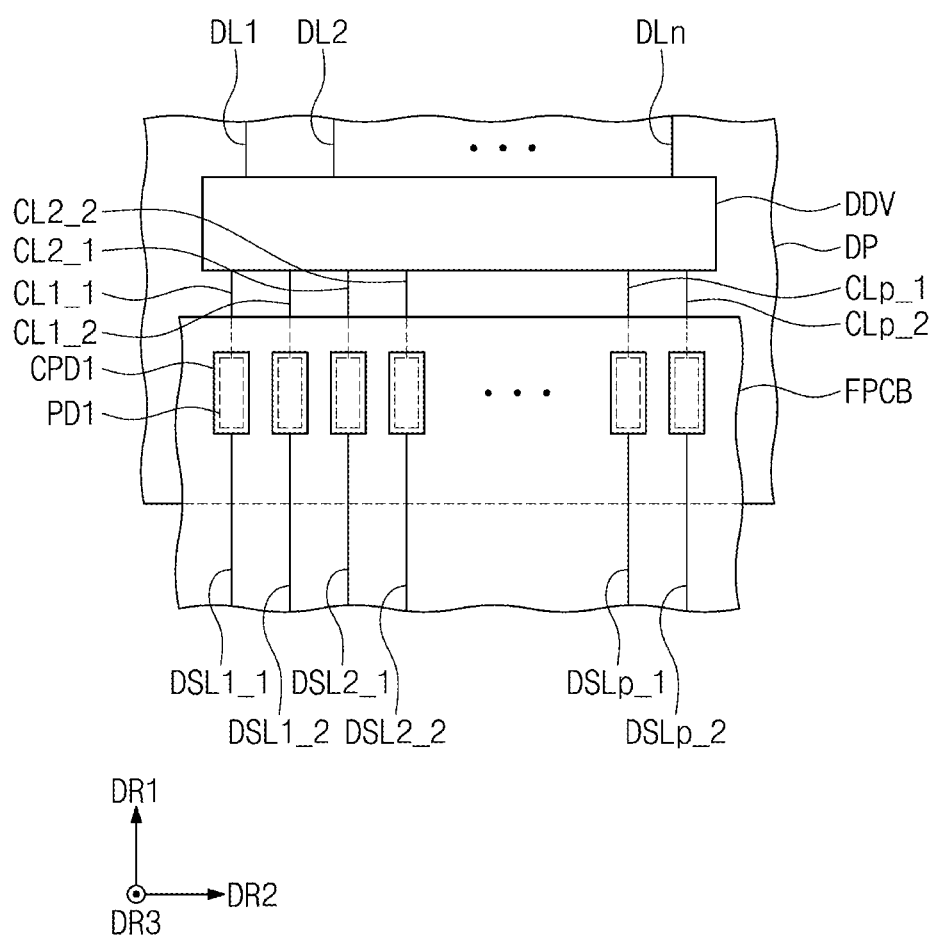
FIG. 9 is a view illustrating a state in which first pads and second connection pads of the display device of FIG. 4 are connected to each other.

FIG. 9 is a view illustrating a state in which first pads and second connection pads of the display device of FIG. 4 are connected to each other.

For example, FIG. 9 illustrates the data lines DL1 to DLn connected to the data driver DDV and the differential signal lines DSL connected to the data driver DDV.

Referring to FIG. 9, first connection pads CPD1 may be disposed on the first pads PD1 so that the first connection pads CPD1 may be connected to the first pads PD1. For example, the first pads PD1 are illustrated by dotted lines. The first connection pads CPD1 may be connected to the first pads PD1 through various bonding methods such as an anisotropic conductive film (ACF) bonding method or an ultrasonic bonding method.

The differential signal lines DSL may include a plurality of first differential signal lines DSL1_1, DSL2_1, . . . , and DSLp_1 and a plurality of second differential signal lines DSL1_2, DSL2_2, . . . , and DSLp_2. The reference symbol 'p' is a natural number. The first differential signal lines DSL1_1, DSL2_1, . . . , and DSLp_1 and the second differential signal lines DSL1_2, DSL2_2, . . . , and DSLp_2 may be alternately arranged at a ratio of 1:1. The reference symbol 'p' is a natural number.

The plurality of first connection lines CL1_1, CL2_1, . . . , CLp_1 and the plurality of second connection lines CL1_2, CL2_2, . . . , CLp_2 may be disposed between the data driver DDV and the first pads PD1. The first connection lines CL1_1, CL2_1, . . . , and CLp_1 and the second connection lines CL1_2, CL2_2, . . . , and CLp_2 may be alternately arranged at a ratio of 1:1.

The first connection lines CL1_1, CL2_1, . . . , and CLp_1 and the second connection lines CL1_2, CL2_2, . . . , and CLp_2 may be connected to the data driver DDV and the first pads PD1. The first differential signal lines DSL1_1, DSL2_1, . . . , and DSLp_1 may be connected to the first connection lines CL1_1, CL2_1, . . . , and CLp_1, respectively. The second differential signal lines DSL1_2, DSL2_2, . . . , and DSLp_2 may be connected to the second connection lines CL1_2, CL2_2, . . . , and CLp_2, respectively.

The first differential signal lines DSL1_1, DSL2_1, . . . , and DSLp_1 may be connected to the data driver DDV through the first connection lines CL1_1, CL2_1, . . . , and CLp_1. The second differential signal lines DSL1_2, DSL2_2, . . . , and DSLp_2 may be connected to the data driver DDV through the second connection lines CL1_2, CL2_2, . . . , and CLp_2.

The first signals applied to the first differential signal lines DSL1_1, DSL2_1, . . . , and DSLp_1 may have phases opposite to those of the second signals applied to the second differential signal lines DSL1_2, DSL2_2, . . . , and DSLp_2. For example, the first signals may have positive polarity, and the second signals may have negative polarity.

One data voltage may be generated and applied to the corresponding data line by the first signal and the second signal, which are transmitted through the pair of first and second differential signal lines adjacent to each other. For example, the first signal and the second signal, which are transmitted through the first differential signal line DSL1_1 and the second differential signal line DSL1_2, may be transmitted to the data driver DDV through the first connection line CL1_1 and the second connection line CL1_2. The data driver may generate a data voltage to be applied to the first data line DL1 by using first and second signals having different phases.

Similarly, the first signal and the second signal, which are transmitted through the first differential signal line DSL2_1 and the second differential signal line DSL2_2, may be transmitted to the data driver DDV through the first connection line CL2_1 and the second connection line CL2_2. The data driver may generate a data voltage to be applied to the second data line DL2 by using the first signal and the second signal having different phases. The signal transmission method is defined as a differential signal method.

The differential signal method may be defined as a signal transmission method using the difference in level (of voltage or current) between two signals. An effect of noise on the signals may be reduced through the differential signal transmission. For example, noise having the same phase may be applied to the first signal and the second signal having different phases. Even if the noise is applied to the first signal and the second signal, since the difference in level between the first signal having the positive polarity and the second signal having the negative polarity is constantly maintained, the differential signal method may reduce the influence from of the noise. The differential signal method may be a method that is well known, and thus, detailed descriptions thereof will be omitted for descriptive convenience.

Figure 10:
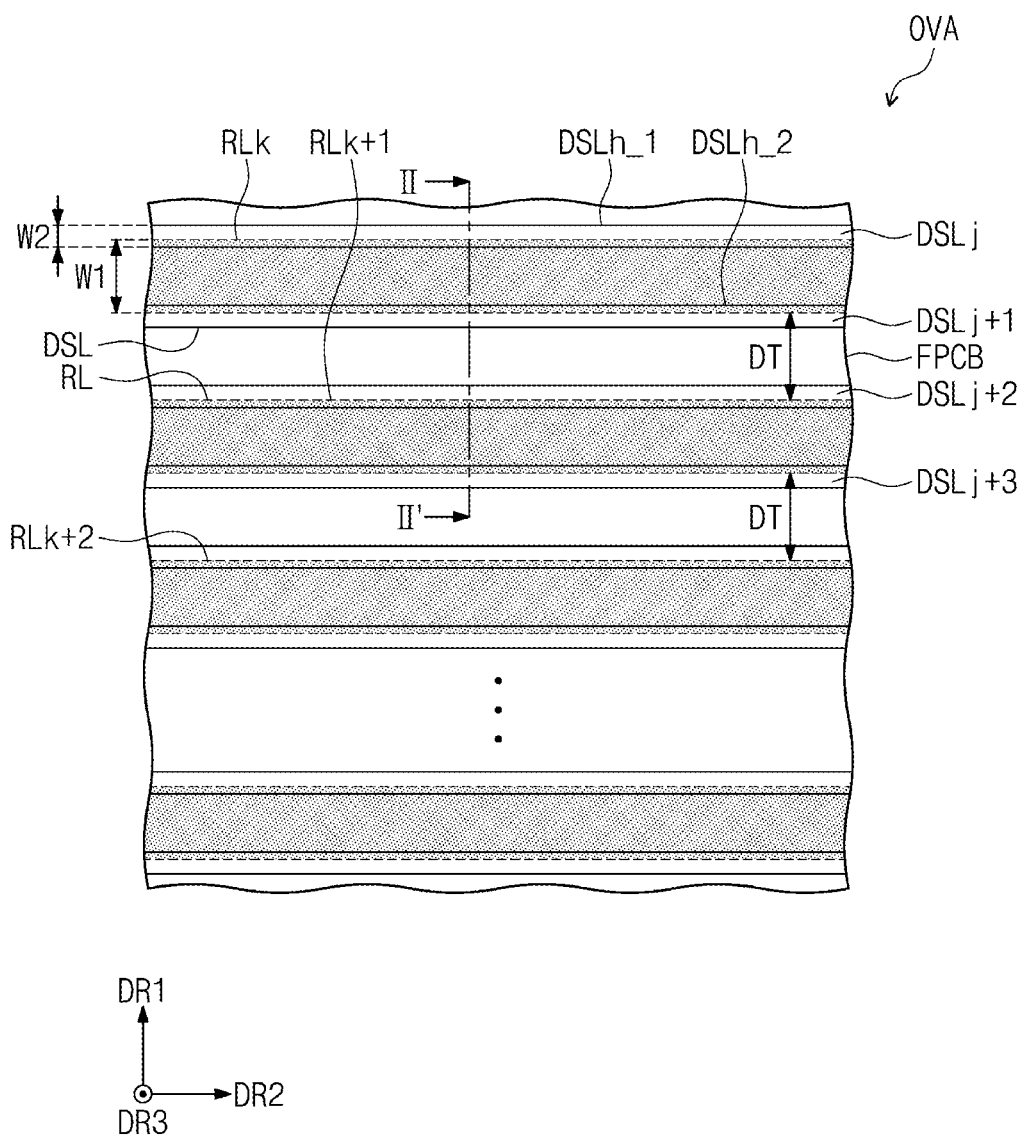
FIG. 10 is a plan view of an overlapping area illustrated by enlarging an overlapping area OVA of FIG. 4 illustrating a configuration of an exemplary embodiment of a flexible circuit board of the display device of FIG. 1.

FIG. 10 is a plan view of an overlapping area illustrated by enlarging an overlapping area OVA of FIG. 4 illustrating a configuration of an exemplary embodiment of a flexible circuit board of the display device of FIG. 1.

For example, in FIG. 10, the differential signal lines DSL are illustrated as solid lines, and the receiving lines RL are illustrated as dotted lines. Also, in FIG. 10, the receiving lines RL are illustrated with a gray color.

Referring to FIG. 10, the differential signal lines DSL and the receiving lines RL may be arranged in the first direction DR1 and extend in the second direction DR2. A first width W1 of each of the receiving lines RL may be different from a second width W2 of each of the differential signal lines DSL in the first direction DR1. For example, the first width W1 may be greater than the second width W2. However, exemplary embodiments are not limited thereto. For example, the first width W1 may be the same as the second width W2 or may be smaller than the second width W2.

When viewed in a plane, each of the receiving lines RL may be disposed between a corresponding pair of first differential signal line and second differential signal line of the differential signal lines DSL. For example, when viewed in a plane, a k-th receiving line RLk may be disposed between an h-th first differential signal line DSLh_1 and an h-th second differential signal line DSLh_2. The reference symbols 'k' and 'h' are natural numbers.

According to this arrangement order, the receiving lines RL may not be continuously arranged between the differential signal lines DSL. For example, the k-th receiving line RLk may be disposed between a j-th differential signal line DSLj and a (j+1)-th differential signal line DSLj+1. The reference symbol j is a natural number. The k+1 th receiving line RLk+1 may be disposed between a (j+2)-th differential signal line DSLj+2 and a (j+3)-th differential signal line DSLj+3. The receiving line RL may not be disposed between the (j+1)-th differential signal line DSLj+1 and the (j+2)-th differential signal line DSLj+2.

The j-th differential signal line DSLj and the (j+2)-th differential signal line DSLj+2 may be defined as first differential signal lines. The (j+1)-th differential signal line DSLj+1 and a (j+3)-th differential signal line DSLj+3 may be defined as second differential signal lines. The j-th differential signal line DSLj may be defined as the h-th first differential signal line DSLh_1, and the (j+1)-th differential signal line DSLj+1 may be defined as the h-th second differential signal line DSLh_2.

Each of the receiving lines RL may partially overlap the corresponding pair of first and second differential signal lines e.g., in the third direction DR3 or in a thickness direction of the flexible circuit board FPCB. For example, when viewed in a plane, the k-th receiving line RLk may partially overlap the h-th first differential signal line DSLh_1 and the h-th second differential signal line DSLh_2. Specifically, both sides of the k-th receiving line RLk, which are opposite to each other in the first direction DR1, may respectively overlap the h-th first differential signal line DSLh_1 and the h-th second differential signal line DSLh_2 when viewed in the plan view.

Each of the other receiving lines RL may also be disposed between the corresponding pair of first differential signal line and second differential signal line to overlap the corresponding pair of first differential signal line and second differential signal line.

The receiving lines RL may be arranged at constant intervals in the first direction DR1. For example, a distance DT between a k-th receiving line RLk and a (k+1)-th receiving line RLk+1 in the first direction DR1 may be the same as a distance DT between a (k+1)-th receiving line RLk+1 and a (k+2)-th receiving line RLk+2 in the first direction DR1.

Figure 11:
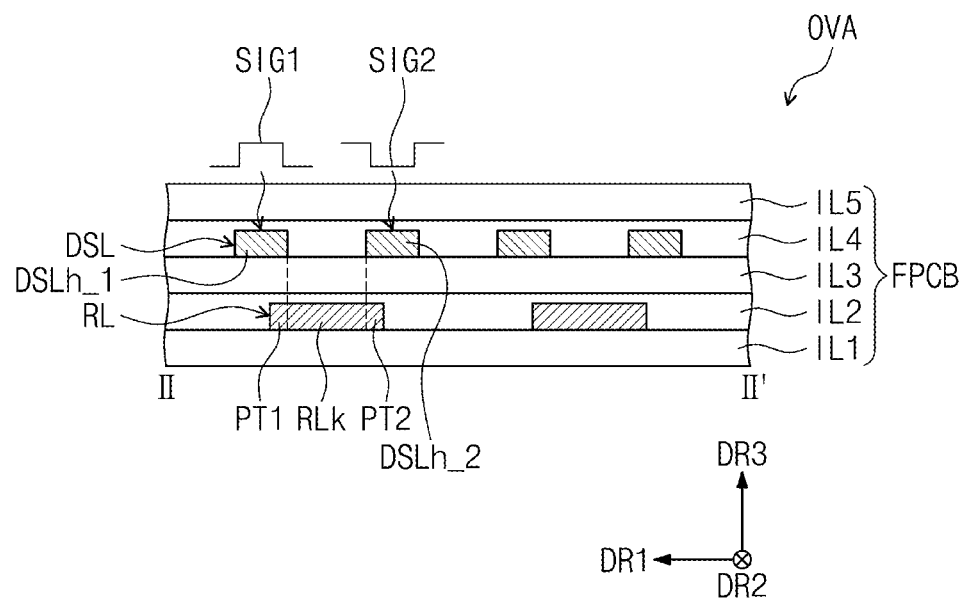
FIG. 11 is a cross-sectional view taken along line II-II' of FIG. 10.
Figure 12:
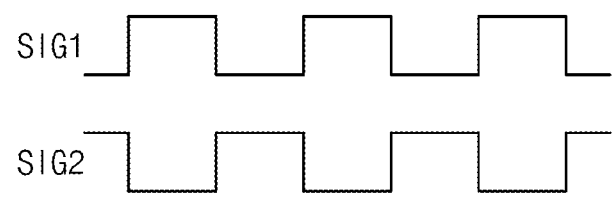
FIG. 12 is a view exemplarily illustrating waveforms of a first signal and a second signal of FIG. 11.

FIG. 11 is a cross-sectional view taken along line II-II' of FIG. 10. FIG. 12 is a view exemplarily illustrating waveforms of the first signal and the second signal of FIG. 11.

Hereinafter, for example, configurations of the k-th receiving line RLk, the h-th first differential signal line DSLh_1, and the h-th second differential signal line DSLh_2 in FIG. 11 will be described.

Referring to FIGS. 11 and 12, the k-th receiving line RLk may be disposed on a layer different from a layer on which each of the h-th first differential signal line DSLh_1 and the h-th second differential signal line DSLh_2 is disposed. For example, the flexible circuit board FPCB may include first, second, third, fourth, and fifth insulating layers IL1, IL2, IL3, IL4, and IL5, which are sequentially stacked or laminated. The k-th receiving line RLk may be disposed on the first insulating layer IL1, and the second insulating layer IL2 may be disposed on the k-th receiving line RLk and the first insulating layer IL1.

The third insulating layer IL3 may be disposed on the second insulating layer IL2. The h-th first differential signal line DSLh_1 and the h-th second differential signal line DSLh_2 may be disposed on the third insulating layer IL3. The fourth insulating layer IL4 may be disposed on the third insulating layer IL3, the h-th first differential signal line DSLh_1, and the h-th second differential signal line DSLh_2, and the fifth insulating layer IL5 may be disposed on the fourth insulating layer IL4.

The k-th receiving line RLk may be disposed on a layer lower than the h-th first differential signal line DSLh_1 and the h-th second differential signal line DSLh_2. However, exemplary embodiments are not limited thereto. For example, the k-th receiving line RLk may be disposed on a layer higher than the h-th first differential signal line DSLh_1 and the h-th second differential signal line DSLh_2.

The differential signal lines DSL, the receiving lines RL, and the transmission lines TL may be connected to the first, second, and third connection pads CPD1, CP2, and CPD3 through via holes defined in the first, second, third, fourth, and fifth insulating layers IL1, IL2, IL3, IL4, and IL5.

When viewed in a plane, a portion of the k-th receiving line RLk, which overlaps the h-th first differential signal line DSLh_1, may be defined as a first portion PT1. A portion of the k-th receiving line RLk, which overlaps the h-th second differential signal line DSLh_2, may be defined as a second portion PT2. For example, the first portion PT1 of the k-th receiving line RLk may overlap the h-th first differential signal line DSLh_1 e.g., in the third direction DR3 or in a thickness direction of the flexible circuit board FPCB. The second portion PT2 of the k-th receiving line RLk may overlap the h-th second differential signal line DSLh_2 e.g., in the third direction DR3 or in the thickness direction of the flexible circuit board FPCB. When viewed in a plane, the first portion PT1 may have the same area as the second portion PT2. For example, a width of the first portion PT1 may be same as a width of the second portion PT2.

A first signal SIG1 having positive polarity may be applied to the h-th first differential signal line DSLh_1. A second signal SIG2 having negative polarity may be applied to the h-th second differential signal line DSLh_2. The first signal SIG1 and the second signal SIG2 may be defined as differential signals.

When a first conductor and a second conductor overlap each other and are disposed vertically, and the positive or negative signal is applied to the first conductor, the signal applied to the first conductor may affect the signal applied to the second conductor. The signal applied to the second conductor may not be maintained at a constant level according to a level of the signal applied to the first conductor and thus may be fluctuated or changed.

For example, when the signal having the positive polarity is applied to the first conductor, ripple (e.g., voltage ripple or current ripple) may occur in the signal applied to the second conductor in a positive direction. When the signal having the negative polarity is applied to the first conductor, ripple (e.g., voltage ripple or current ripple) may occur in the signal applied to the second conductor in a negative direction. This phenomenon may be defined as a coupling phenomenon.

When the k-th receiving line RLk is disposed to overlap only the h-th first differential signal line DSLh_1, the ripple may occur in a signal sensed by the k-th receiving line RLk in the positive direction by the first signal SIG1 having the positive polarity. Also, when the k-th receiving line RLk is disposed to overlap only the n-th second differential signal line DSLh_2, the ripple may occur in a signal sensed by the k-th receiving line RLk in the negative direction by the second signal SIG2 having the negative polarity. This ripple may be defined as noise in the sense signal.

However, in an exemplary embodiment, the k-th receiving line RLk may be disposed between the h-th first differential signal line DSLh_1 and the h-th second differential signal line DSLh_2. Thus, the coupling phenomenon occurred between the first signal SIG1 and the sensing signal and the coupling phenomenon occurred between the second signal SIG2 and the sensing signal may be offset with respect to each other. For example, the coupling phenomenon caused by the first signal SIG1 having the positive polarity and the coupling phenomenon caused by the second signal SIG2 having the negative polarity may be offset with respect to each other. As a result, the noise of the sensing signal due to the coupling phenomenon may be reduced.

Hereinafter, a flexible circuit board according to various exemplary embodiments will be described. In addition, flexible circuit boards according to various exemplary embodiments will be described based on the constituents different from the flexible circuit board FPCB described above, and the same constituent will be illustrated by using the same reference numerals.

Figure 13:
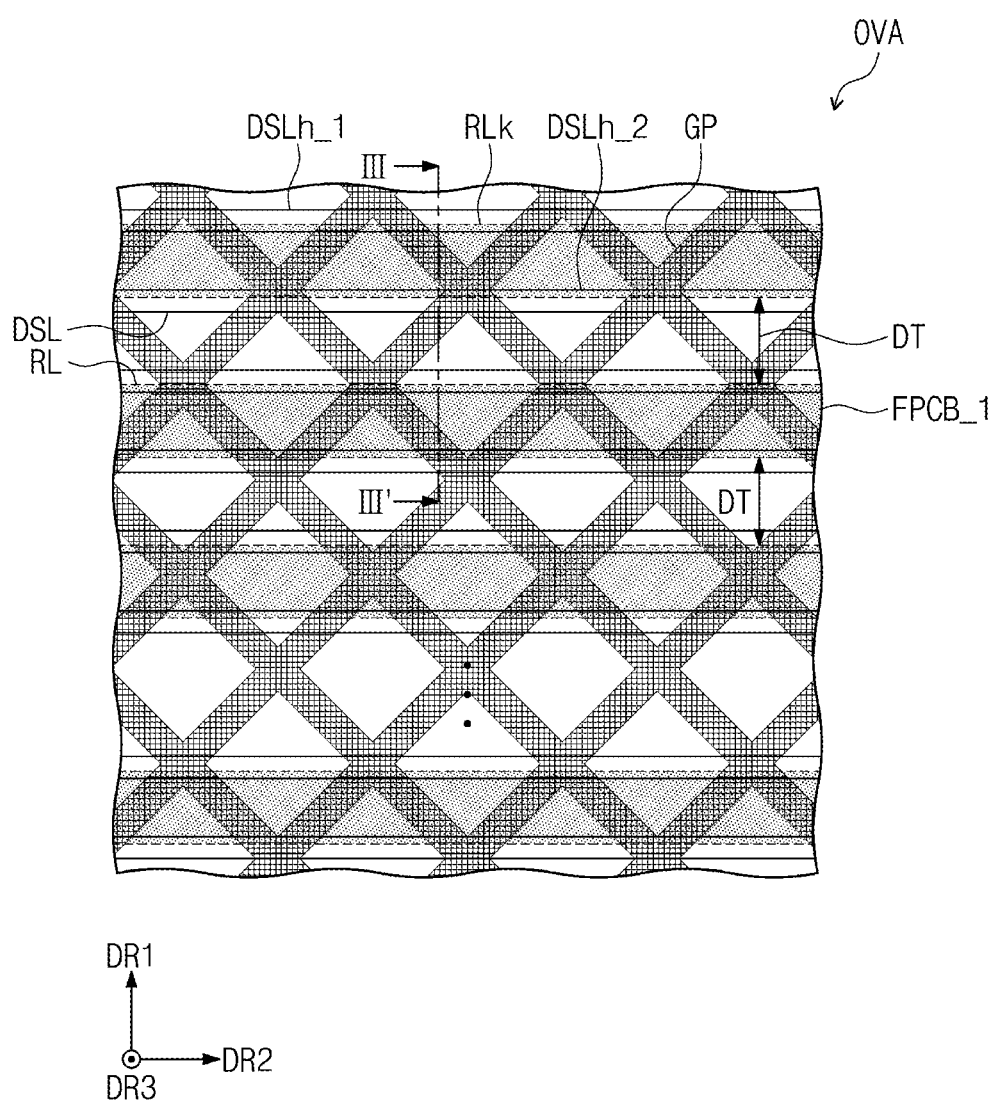
FIG. 13 is a view illustrating a configuration of another exemplary embodiment of the flexible circuit board of the display device of FIG. 1.
Figure 14:
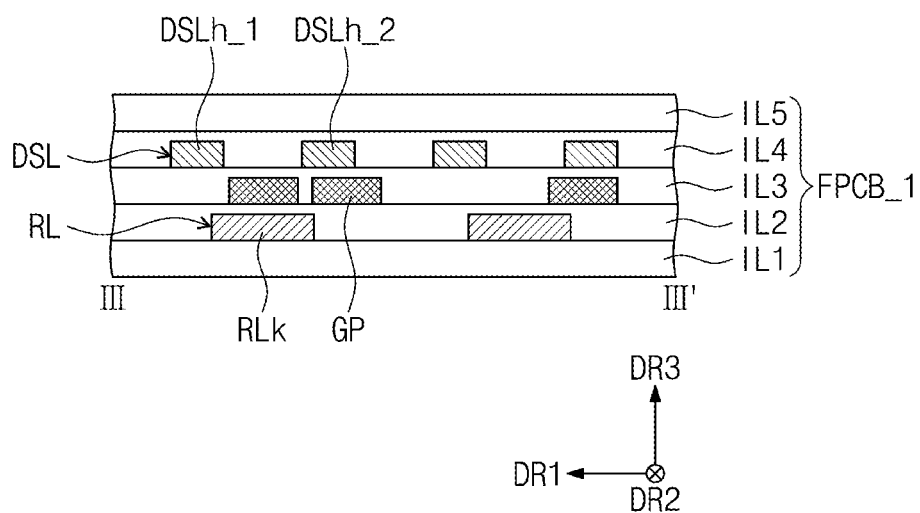
FIG. 14 is a cross-sectional view taken along line III-III' of FIG. 13.

FIG. 13 is a view illustrating a configuration of another exemplary embodiment of a flexible circuit board. FIG. 14 is a cross-sectional view taken along line of FIG. 12.

For example, FIG. 13 is a plan view corresponding to FIG. 10, and FIG. 14 is a cross-sectional view corresponding to FIG. 11.

Referring to FIGS. 13 and 14, a flexible circuit board FPCB_1 may include differential signal lines DSL, receiving lines RL, and a ground pattern GP. When viewed in a plane, each of the receiving lines RL may be disposed between the corresponding pair of first differential signal line and second differential signal line to partially overlap the corresponding pair of first differential signal line and second differential signal line.

The ground pattern GP may be disposed between a layer on which the differential signal lines DSL are disposed and a layer on which the receiving lines RL are disposed. For example, the receiving lines RL may be disposed on a first insulating layer IL1, the differential signal lines DSL may be disposed on a third insulating layer IL3, and the ground pattern GP may be disposed on a second insulating layer IL2.

When viewed in a plane, the ground pattern GP may have a mesh shape. A ground voltage may be applied to the ground pattern GP. The ground pattern GP may block signal interference between differential signals applied to the differential signal lines DSL and sensing signals received through the receiving lines RL.

The ground pattern GP may not have a mesh pattern and be implemented as a through electrode. In this case, a capacitance of a parasitic capacitor generated between the receiving lines RL and the ground pattern GP may be increased. Current flowing through the receiving lines RL may leak into the parasitic capacitor. The leakage current may be proportional to the capacitance of the parasitic capacitor.

In the exemplary embodiment, since the ground pattern GP has the mesh shape, the capacitance of the parasitic capacitor generated between the receiving lines RL and the ground pattern GP may be reduced. Therefore, the leakage current may be reduced. Similarly, the capacitance of the parasitic capacitor generated between the ground pattern GP having the mesh shape and the differential signal lines DSL may also be reduced.

Figure 15:
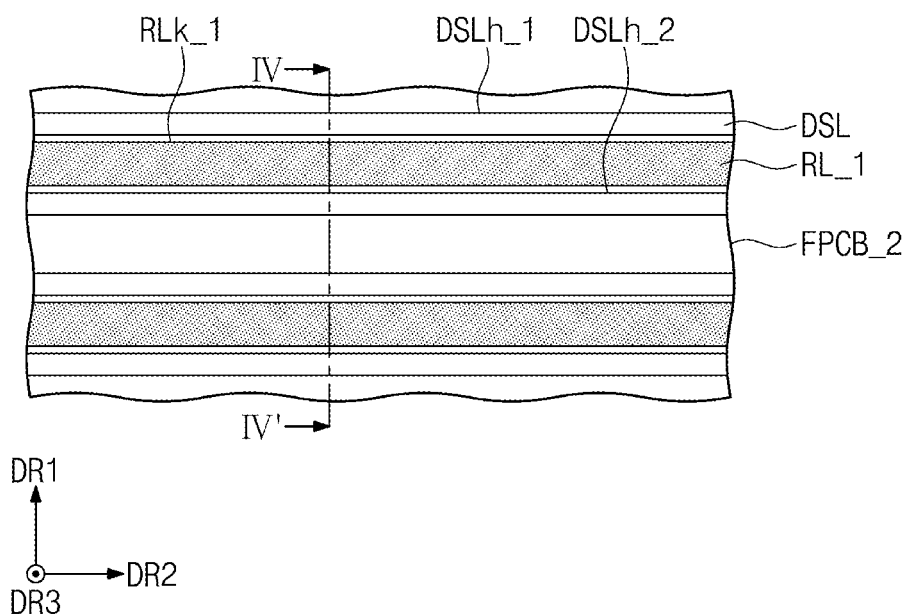
FIG. 15 is a view illustrating a configuration of another exemplary embodiment of the flexible circuit board of the display device of FIG. 1.
Figure 16:
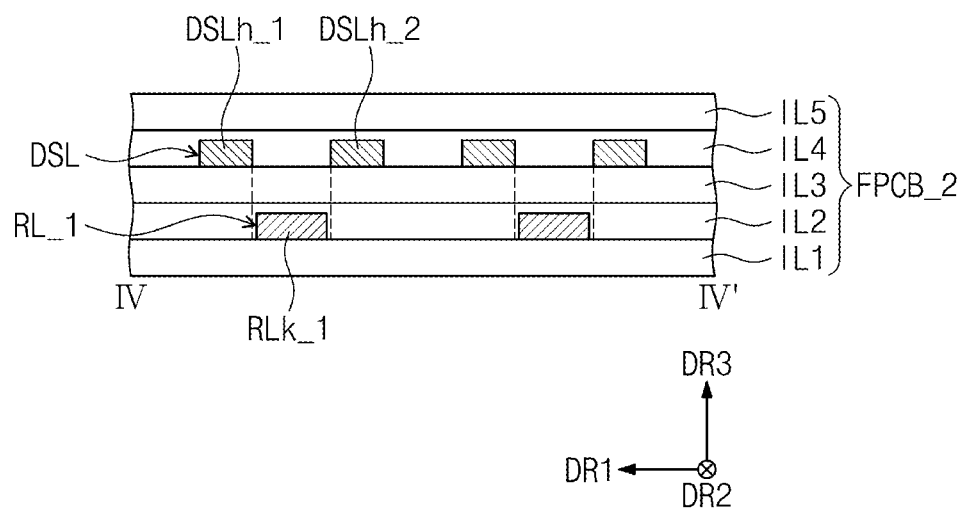
FIG. 16 is a cross-sectional view taken along line IV-IV' of FIG. 15.

FIG. 15 is a view illustrating a configuration of another exemplary embodiment of a flexible circuit board of the display device of FIG. 1. FIG. 16 is a cross-sectional view taken along line IV-IV' of FIG. 15.

For example, FIG. 15 is a plan view corresponding to FIG. 10, and FIG. 16 is a cross-sectional view corresponding to FIG. 11.

Referring to FIGS. 15 and 16, a flexible circuit board FPCB_2 may include differential signal lines DSL and receiving lines RL_1. When viewed in a plane, each of a receiving lines RL_1 may be disposed between a corresponding pair of first differential signal line and second differential signal line and may not overlap the corresponding pair of first differential signal line and second differential signal line.

For example, a k-th receiving line RLk_1 may be disposed between an h-th first differential signal line DSLh_1 and an h-th second differential signal line DSLh_2. The k-th receiving line RLk_1 may not overlap the h-th first differential signal line DSLh_1 and the h-th second differential signal line DSLh_2.

Figure 17:
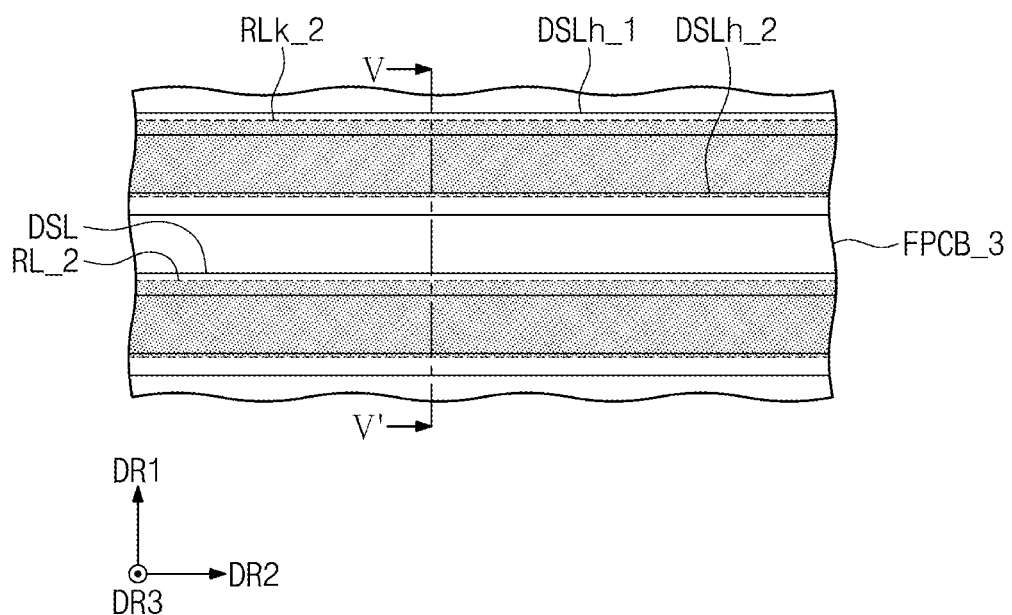
FIG. 17 is a view illustrating a configuration of another exemplary embodiment of the flexible circuit board of the display device of FIG. 1.
Figure 18:
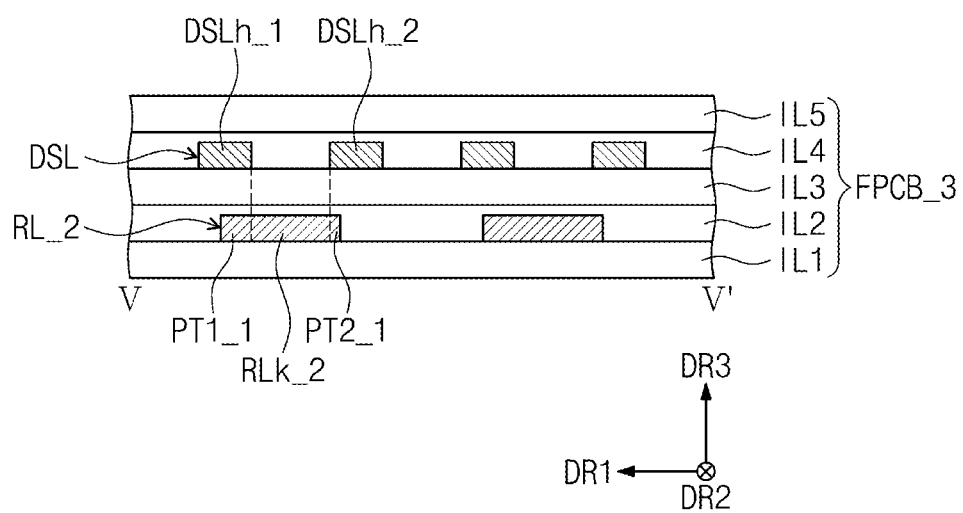
FIG. 18 is a cross-sectional view taken along line IV-IV' of FIG. 17.

FIG. 17 is a view illustrating a configuration of another exemplary embodiment of a flexible circuit board of the display device of FIG. 1. FIG. 18 is a cross-sectional view taken along line IV-IV' of FIG. 17.

For example, FIG. 17 is a plan view corresponding to FIG. 10, and FIG. 18 is a cross-sectional view corresponding to FIG. 11.

Referring to FIGS. 17 and 18, a flexible circuit board FPCB_3 may include differential signal lines DSL and receiving lines RL_2. When viewed in a plane, each of the receiving lines RL_2 may be disposed between a pair of first differential signal line and second differential signal line to partially overlap the pair of first differential signal lines and second differential signal line.

For example, a k-th receiving line RLk_2 may be disposed between an h-th first differential signal line DSLh_1 and an h-th second differential signal line DSLh_2. Both sides of the k-th receiving line RLk_2 may overlap the h-th first differential signal line DSLh_1 and the h-th second differential signal line DSLh_2.

When viewed in a plane, a first part PT1_1 of the k-th receiving line RLk_2, which overlaps the h-th first differential signal line DSLh_1, may have an area different from that of a second portion PT2_1 of the k-th receiving line RLk_2, which overlaps the h-th second differential signal line DSLh_2. For example, when viewed in a plane, the area of the first portion PT1_1 may be greater than that of the second portion PT2_1. However, exemplary embodiment are not limited thereto. For example, the area of the second part PT2_1 may be greater than that of the first part PT1_1.

Figure 19:
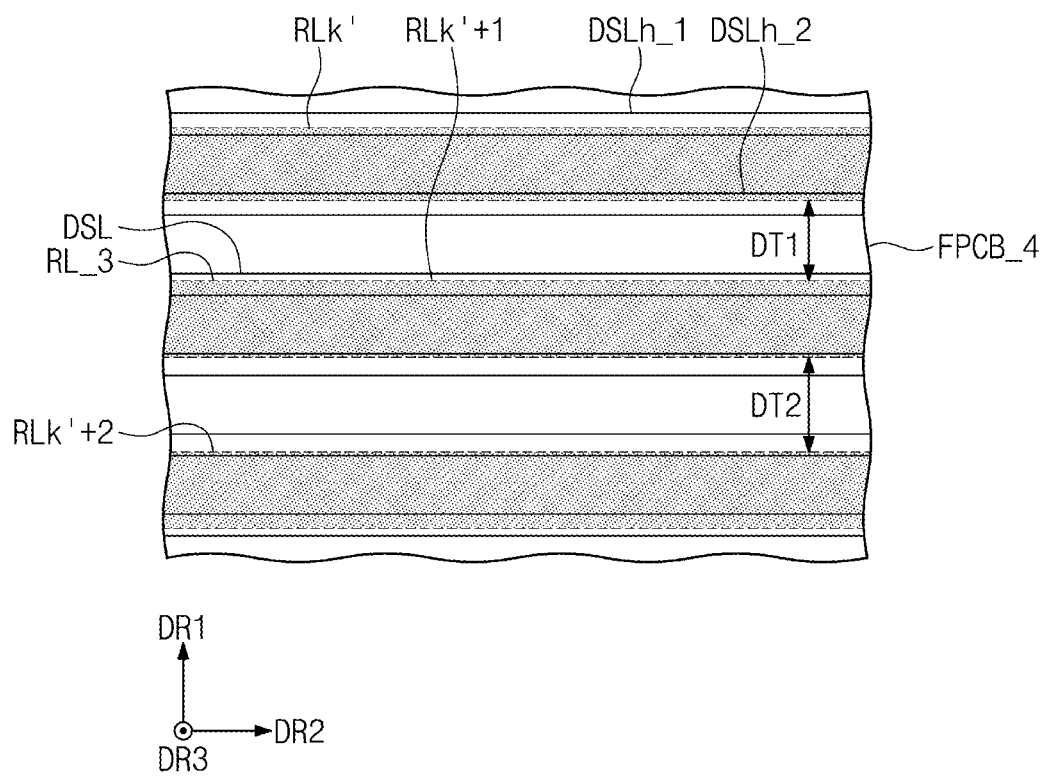
FIG. 19 is a view illustrating a configuration of another exemplary embodiment of the flexible circuit board of the display device of FIG. 1.

FIG. 19 is a view illustrating a configuration of another exemplary embodiment of a flexible circuit board of the display device of FIG. 1.

For example, FIG. 19 illustrates a plan view corresponding to FIG. 10.

Referring to FIG. 19, a flexible circuit board FPCB_4 may include differential signal lines DSL and receiving lines RL_3 disposed between the differential signal lines DSL to partially overlap the differential signal lines DSL.

The receiving lines RL_3 may be arranged at non-constant intervals in the first direction DR1. For example, a distance DT1 between a k-th receiving line RLk' and a (k+1)-th receiving line RLk'+1 in the first direction DR1 may be different from a distance DT2 between a (k+1)-th receiving line RLk'+1 and a (k+2)-th receiving line RLk'+2 in the first direction DR1.

Figure 20:
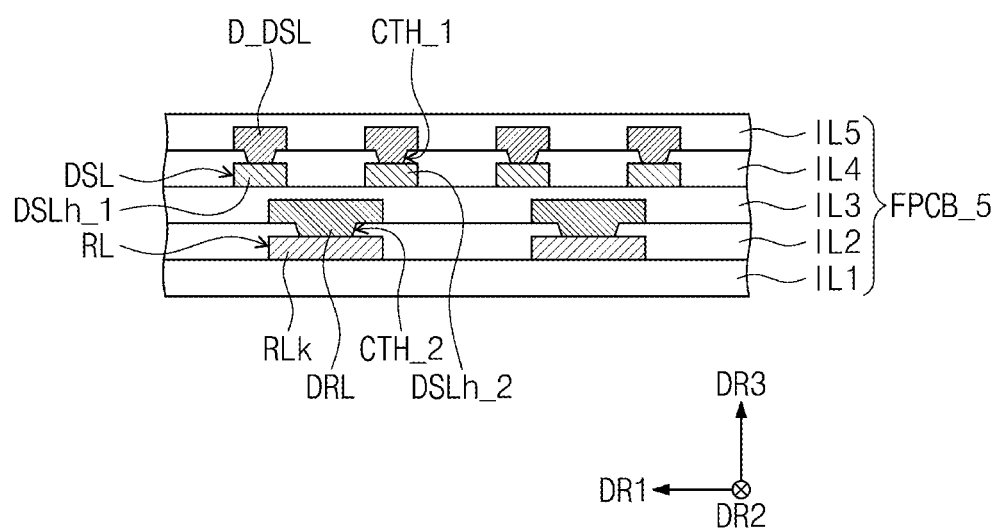
FIG. 20 is a view illustrating a configuration of another exemplary embodiment of the flexible circuit board of the display device of FIG. 1.

FIG. 20 is a view illustrating a configuration of another exemplary embodiment of a flexible circuit board of the display device of FIG. 1.

For example, FIG. 20 is a cross-sectional view corresponding to FIG. 11.

Referring to FIG. 20, a flexible circuit board FPCB_5 may include differential signal lines DSL, receiving lines RL, dummy differential lines D_DSL, and dummy receiving lines DRL. The dummy differential lines D_DSL may be disposed on the differential signal lines DSL and connected to the differential signal lines DSL. The dummy receiving lines DRL may be disposed on the receiving lines RL and connected to the receiving lines RL.

The dummy differential line D_DSL disposed on an h-th first differential signal line DSLh_1 among the dummy differential lines D_DSL may be defined as a first dummy differential line. The dummy differential line D_DSL disposed on an h-th second differential signal line DSLh_2 among the dummy differential lines D_DSL may be defined as a second dummy differential line.

The dummy differential lines D_DSL may be disposed on a fourth insulating layer IL4 and be connected to the differential signal lines DSL through contact holes CTH_1 defined in the fourth insulating layer IL4. The dummy receiving lines DRL may be disposed on the second insulating layer IL2 and be connected to the receiving lines RL through contact holes CTH_2 defined in the second insulating layer IL2.

When signals are transmitted through lines disposed on two layers and connected to each other rather than lines disposed on a single layer, signal transmission characteristics may be improved. Therefore, in an exemplary embodiment, differential signals transmitted through the differential signal lines DSL and the dummy differential lines D_DSL and sensing signals transmitted through the receiving lines RL and the dummy receiving lines DRL may be improved in signal transmission characteristic. For example, the structure in which the lines disposed on the two layers are connected to each other has been described, but exemplary embodiments are not limited thereto. For example, the lines may be disposed on two or more layers and be connected to each other.

According to the exemplary embodiment, the receiving line that receives the sensing signal may be disposed between the first differential signal line that transmits the positive signal and the second differential signal line that transmits the negative signal. Therefore, the coupling phenomena due to the positive and negative signals having the different polarities may be removed. As a result, the noise of the sensing signal due to the coupling phenomenon may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel;
    an input sensor disposed on the display panel;
    a flexible circuit board connected to the display panel and the input sensor;
    a first differential signal line and a second differential signal line, which are disposed on the flexible circuit board and connected to the display panel; and
    a transmission line and a receiving line, which are disposed on the flexible circuit board and connected to the input sensor,
    wherein, in a plan view, the receiving line is disposed between the first differential signal line and the second differential signal line.

2. The display device of claim 1, wherein a first signal applied to the first differential signal line has a phase opposite to that of a second signal applied to the second differential signal line.

3. The display device of claim 1, wherein the receiving line is disposed on a first layer different from a second layer on which each of the first differential signal line and the second differential signal line is disposed.

4. The display device of claim 1, wherein the receiving line partially overlaps the first differential signal line and the second differential signal line in a thickness direction of the flexible circuit board.

5. The display device of claim 1, wherein the receiving line, the first differential signal line, and the second differential signal line are arranged in a first direction and extends in a second direction intersecting the first direction, and
    both sides of the receiving line, which are opposite to each other in the first direction, overlap the first differential signal line and the second differential signal line in a thickness direction of the flexible circuit board.

6. The display device of claim 5, wherein, in a plan view, a width of a first portion of the receiving line, which overlaps the first differential signal line, is same as a width of a second portion of the receiving line, which overlaps the second differential signal line.

7. The display device of claim 5, wherein the receiving line has a width greater than that of each of the first differential signal line and the second differential signal line in the first direction.

8. The display device of claim 5, wherein each of the receiving line, the first differential signal line, and the second differential signal line is provided in plurality, and
    a plurality of receiving lines are arranged in constant intervals in the first direction.

9. The display device of claim 8, wherein a plurality of first differential signal lines and a plurality of second differential signal lines are alternately disposed, and
    a k-th receiving line is disposed between an h-th first differential signal line and an h-th second differential signal line, the 'k' and 'h' are natural numbers.

10. The display device of claim 1, wherein the transmission line does not overlap the first differential signal line and the second differential signal line in a thickness direction of the flexible circuit board.

11. The display device of claim 1, wherein the input sensor comprises:
- a first sensing electrode connected to the transmission line; and
- a second sensing electrode connected to the receiving line, and wherein the display panel comprises:
- a pixel;
- a gate line and a data line, which are connected to the pixel; and
- a data driver connected to the data line, the first differential signal line, and the second differential signal line.

12. The display device of claim 1, further comprising a ground pattern disposed between a first layer on which the first and second differential signal lines are disposed and a second layer on which the receiving line is disposed.

13. The display device of claim 12, wherein, in a plan view, the ground pattern has a mesh shape.

14. The display device of claim 1, wherein, the receiving line does not overlap the first differential signal line and the second differential signal line in a thickness direction of the flexible circuit board.

15. The display device of claim 1, wherein, both sides of the receiving line overlap the first differential signal line and the second differential signal line in a thickness direction of the flexible circuit board, and
- in a plan view, a width of a first portion of the receiving line, which overlaps the first differential signal line, is different from a width of a second portion of the receiving line, which overlaps the second differential signal line.

16. The display device of claim 1, wherein each of the receiving line, the first differential signal line, and the second differential signal line is provided in plurality, and
- a first distance between a k-th receiving line and a (k+1)-th receiving line of a plurality of receiving lines is different from a second distance between the (k+1)-th receiving line and a (k+2)-th receiving line of the plurality of receiving lines, the 'k' is a natural number.

17. The display device of claim 1, further comprising:
- a dummy receiving line disposed on the receiving line and connected to the receiving line;
- a first dummy differential line disposed on the first differential signal line and connected to the first differential signal line; and
- a second dummy differential line disposed on the second differential signal line and connected to the second differential signal line.

18. A display device comprising:
- a display panel;
- an input sensor disposed on the display panel;
- a flexible circuit board connected to the display panel and the input sensor;
- a first differential signal line and a second differential signal line, which are disposed on the flexible circuit board and connected to the display panel and to which signals having different phases are applied, respectively; and
- a receiving line disposed on a first layer different from a second layer, on which the first and second differential signal lines are disposed, on the flexible circuit board, the receiving line connected to the input sensor,
- wherein, in a plan view, the receiving line is disposed between the first differential signal line and the second differential signal line.

19. The display device of claim 18, wherein the receiving line, the first differential signal line, and the second differential signal line are arranged in a first direction and extends in a second direction intersecting the first direction, and
- both sides of the receiving line, which are opposite to each other in the first direction, overlap the first differential signal line and the second differential signal line in a thickness direction of the flexible circuit board.

20. A display device comprising:
- a display panel;
- an input sensor disposed on the display panel;
- a flexible circuit board connected to the display panel and the input sensor;
- a plurality of differential signal lines disposed on the flexible circuit board and connected to the display panel; and
- a plurality of receiving lines disposed on the flexible circuit board and connected to the input sensor,
- wherein, in a plan view, a k-th receiving line is disposed between a j-th differential signal line and a (j+1)-th differential signal line, and a (k+1)-th receiving line is disposed between a (j+2)-th differential signal line and a (j+3)-th differential signal line, the 'j' and 'k' are natural numbers.

* * * * *